United States Patent
van de Ven et al.

(10) Patent No.: US 9,534,741 B2
(45) Date of Patent: Jan. 3, 2017

(54) LIGHTING DEVICES WITH ILLUMINATION REGIONS HAVING DIFFERENT GAMUT PROPERTIES

(71) Applicant: Cree, Inc., Durham, NC (US)

(72) Inventors: Antony Paul van de Ven, Hong Kong (CN); Benjamin A. Jacobson, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/338,895

(22) Filed: Jul. 23, 2014

(65) Prior Publication Data
US 2016/0025273 A1  Jan. 28, 2016

(51) Int. Cl.
| | | |
|---|---|---|
| *H01L 33/50* | (2010.01) | |
| *H01L 51/52* | (2006.01) | |
| *F21K 99/00* | (2016.01) | |
| *F21S 8/00* | (2006.01) | |
| *F21V 7/00* | (2006.01) | |

(Continued)

(52) U.S. Cl.
CPC ............... *F21K 9/1355* (2013.01); *F21K 9/23* (2016.08); *F21K 9/64* (2016.08); *F21S 8/00* (2013.01); *F21V 3/049* (2013.01); *F21V 7/0025* (2013.01); *F21V 9/16* (2013.01); *F21Y 2101/00* (2013.01); *H01L 2224/32245* (2013.01);

(Continued)

(58) Field of Classification Search
CPC ........ H01L 33/32; H01L 33/06; H01L 33/007; H01L 33/08; H01L 31/67; H01L 51/52; H01L 33/50
See application file for complete search history.

(56) References Cited

U.S. PATENT DOCUMENTS

| | | |
|---|---|---|
| 6,600,175 B1 | 7/2003 | Baretz et al. |
| 6,940,101 B2 | 9/2005 | Yano et al. |

(Continued)

FOREIGN PATENT DOCUMENTS

| | | |
|---|---|---|
| JP | 2005061706 A | 3/2005 |
| JP | 2009152213 A | 7/2009 |
| WO | 2009041171 A1 | 4/2009 |

OTHER PUBLICATIONS

U.S. Appl. No. 14/259,993, filed Apr. 23, 2014.

(Continued)

*Primary Examiner* — Thomas L Dickey
*Assistant Examiner* — Damon Hillman
(74) *Attorney, Agent, or Firm* — Withrow + Terranova, P.L.L.C.; Vincent K. Gustafson

(57) ABSTRACT

Lighting devices with multiple light-emitting regions may be arranged to transmit or reflect emission portions or beams having different gamut properties, such as different gamut area index or relative gamut values. Different light transmitting surfaces or areas may be arranged to transmit emission portions or light beams having different gamut properties in different directions. Different gamut properties of different beams or emission portions may be produced by different electrically activated emitters and/or light-affecting materials such as notch filters, lumiphoric materials, and/or color pigments. A retrofit element may include a light-affecting (e.g., gamut-altering) material arranged to span across a portion of a light output surface or area of a lighting device and structure arranged for removable attachment to the lighting device.

32 Claims, 19 Drawing Sheets

(51) Int. Cl.
  *F21V 9/16* (2006.01)
  *F21V 3/04* (2006.01)
  *F21Y 101/00* (2016.01)
(52) U.S. Cl.
  CPC .............. *H01L 2224/48091* (2013.01); *H01L 2224/73265* (2013.01); *H01L 2224/8592* (2013.01); *H01L 2924/181* (2013.01)

(56) References Cited

U.S. PATENT DOCUMENTS

| | | |
|---|---|---|
| 7,213,940 B1 | 5/2007 | Van de Ven et al. |
| 7,293,889 B2 | 11/2007 | Kamiya et al. |
| 7,365,485 B2 | 4/2008 | Fukasawa et al. |
| 7,564,180 B2 | 7/2009 | Brandes |
| 7,665,865 B1 | 2/2010 | Hulse et al. |
| 7,687,753 B2 | 3/2010 | Ashdown |
| 7,744,242 B2 | 6/2010 | Kramer |
| 7,768,192 B2 | 8/2010 | Van De Ven et al. |
| 7,781,953 B2 | 8/2010 | Su |
| 7,828,460 B2 | 11/2010 | Van De Ven et al. |
| 7,845,823 B2 | 12/2010 | Mueller et al. |
| 7,918,581 B2 | 4/2011 | Van De Ven et al. |
| 8,038,317 B2 | 10/2011 | Van De Ven et al. |
| 8,136,965 B2 | 3/2012 | Pickard et al. |
| 8,201,966 B2 | 6/2012 | Hall et al. |
| 8,436,556 B2 | 5/2013 | Eisele et al. |
| 8,466,611 B2 | 6/2013 | Negley et al. |
| 8,508,127 B2 | 8/2013 | Negley et al. |
| 8,575,836 B2 | 11/2013 | van de Ven |
| 8,593,074 B2 | 11/2013 | Hatley et al. |
| 8,596,821 B2 | 12/2013 | Brandes et al. |
| 8,646,944 B2 | 2/2014 | Villard |
| 2005/0184638 A1 | 8/2005 | Mueller et al. |
| 2005/0265024 A1 | 12/2005 | Luk |
| 2005/0275937 A1 | 12/2005 | Wu et al. |
| 2006/0221272 A1 | 10/2006 | Negley et al. |
| 2007/0063321 A1 | 3/2007 | Han et al. |
| 2007/0170447 A1 | 7/2007 | Negley et al. |
| 2007/0241657 A1 | 10/2007 | Radkov et al. |
| 2007/0267976 A1 | 11/2007 | Bohler et al. |
| 2008/0173884 A1 | 7/2008 | Chitnis et al. |
| 2008/0179611 A1 | 7/2008 | Chitnis et al. |
| 2008/0308825 A1 | 12/2008 | Chakraborty et al. |
| 2009/0002986 A1 | 1/2009 | Medendorp, Jr. et al. |
| 2009/0021151 A1* | 1/2009 | Fukuda .............. H01L 51/5265 313/504 |
| 2009/0184616 A1 | 7/2009 | Van De Ven et al. |
| 2009/0227847 A1 | 9/2009 | Tepper et al. |
| 2009/0243455 A1 | 10/2009 | Biebel et al. |
| 2009/0296384 A1 | 12/2009 | Van De Ven et al. |
| 2010/0110659 A1 | 5/2010 | Nakajima |
| 2010/0127283 A1 | 5/2010 | van de Ven et al. |
| 2010/0254129 A1 | 10/2010 | Le Toquin et al. |
| 2010/0277907 A1 | 11/2010 | Phipps et al. |
| 2011/0037388 A1 | 2/2011 | Lou et al. |
| 2011/0182065 A1 | 7/2011 | Negley et al. |
| 2011/0215345 A1 | 9/2011 | Tarsa et al. |
| 2011/0220920 A1 | 9/2011 | Collins et al. |
| 2011/0299284 A1 | 12/2011 | Van De Ven et al. |
| 2012/0039073 A1 | 2/2012 | Tong |
| 2012/0051041 A1 | 3/2012 | Edmond et al. |
| 2012/0057327 A1* | 3/2012 | Le .......................... F21K 9/135 362/84 |
| 2012/0262902 A1 | 10/2012 | Pickard et al. |
| 2012/0306355 A1 | 12/2012 | Seibel, II |
| 2012/0327650 A1 | 12/2012 | Lay et al. |
| 2013/0113358 A1 | 5/2013 | Progl et al. |
| 2013/0170199 A1 | 7/2013 | Athalye et al. |
| 2013/0208457 A1 | 8/2013 | Durkee et al. |
| 2013/0250567 A1 | 9/2013 | Edmond et al. |
| 2013/0271981 A1 | 10/2013 | Hussell et al. |
| 2014/0009932 A1 | 1/2014 | Tarsa et al. |
| 2014/0063779 A1* | 3/2014 | Bradford ............... F21K 9/1375 362/84 |
| 2014/0078728 A1 | 3/2014 | Rodgers et al. |
| 2014/0191648 A1 | 7/2014 | Lin |
| 2014/0268794 A1 | 9/2014 | Donofrio et al. |
| 2014/0285996 A1* | 9/2014 | Radkov .............. C09K 11/0883 362/84 |
| 2015/0098206 A1* | 4/2015 | Pickard ..................... F21K 9/56 362/84 |

OTHER PUBLICATIONS

U.S. Appl. No. 14/298,229, filed Jun. 6, 2014.
Author Unknown, "CALiPER Retail Lamps Study 3," Solid-State Lighting Program, Feb. 2014, Pacific Northwest National Laboratory, U.S. Department of Energy, 48 pages.
Rea, Mark S., "Value Metrics for Better Lighting," vol. PM228, 2013, SPIE Press, pp. 36-43, 52-63.
Author Unknown, "Bright Tomorrow Lighting Competition (L Prize™)," U.S. Department of Energy, 08NT006643, Revision 1, Jun. 26, 2009, www.lightingprize.org, 18 pages.

* cited by examiner

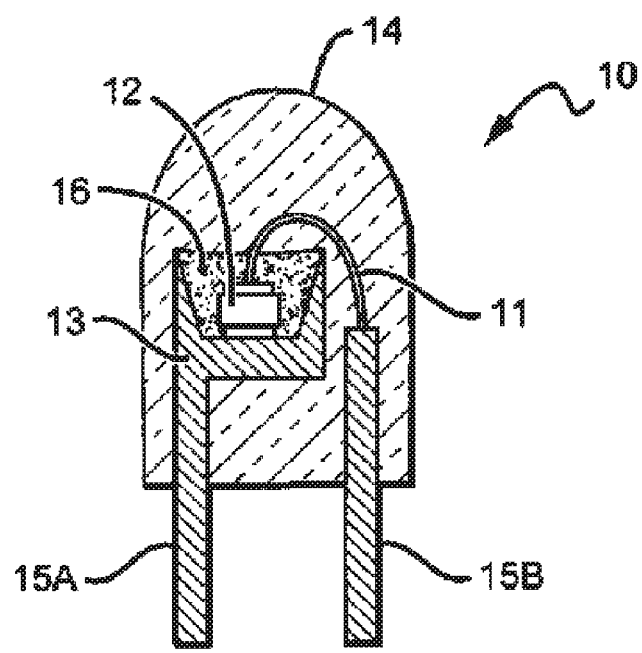
FIG._1
(RELATED ART)
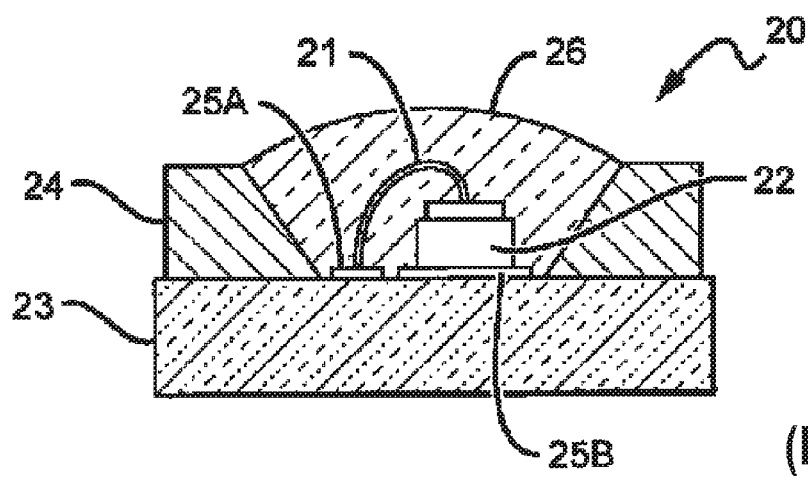
FIG._2
(RELATED ART)

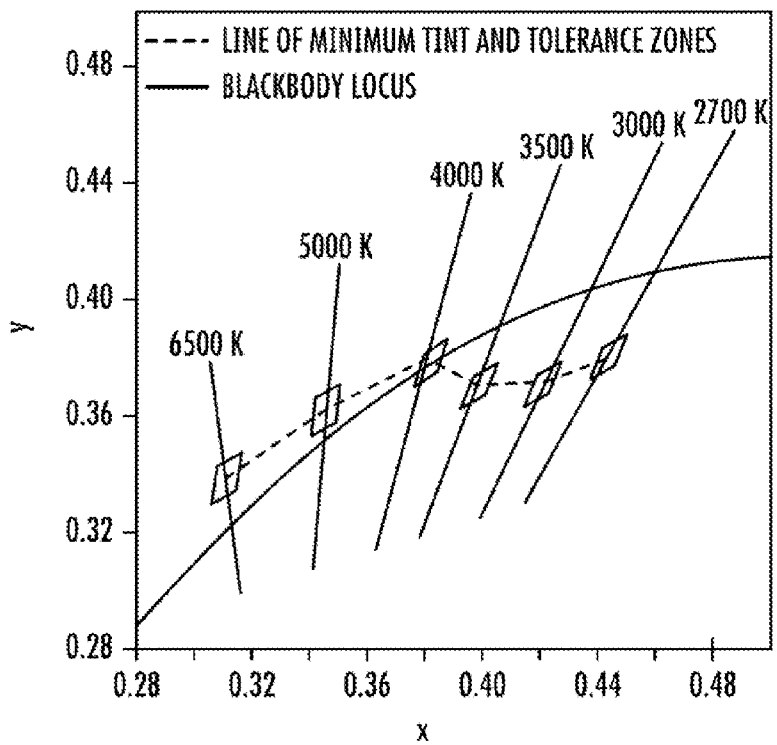
FIG._3
(RELATED ART)
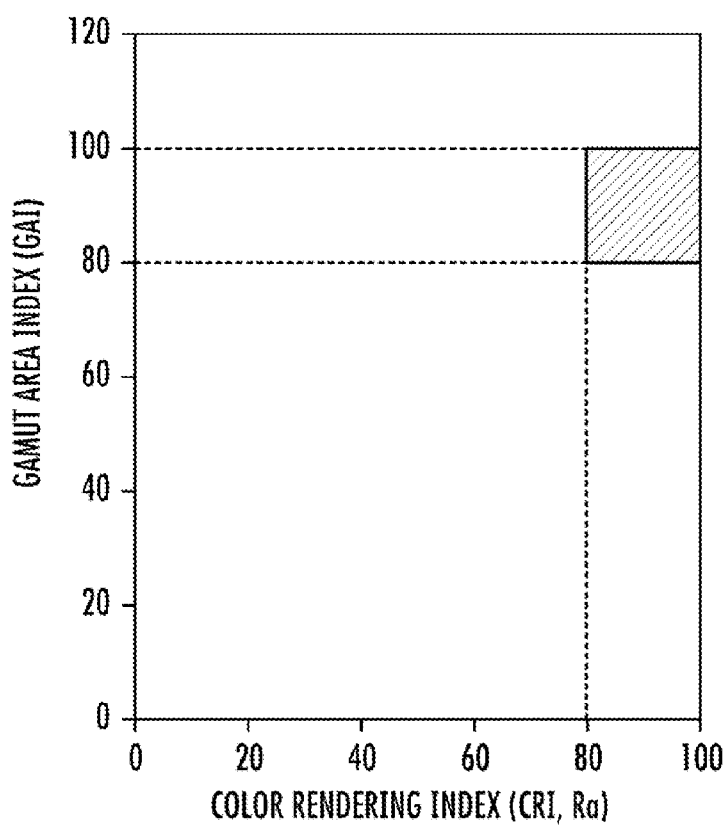
FIG._4
(RELATED ART)

| # | Light source | CCT | CRI | GAI | $x$ | $y$ | System lm/W | S/P |
|---|---|---|---|---|---|---|---|---|
| 1.1 | HPS, 400 W | 2050 | 15 | 14 | 0.5208 | 0.4134 | 96 | 0.66 |
| 1.2 | Pulse-start MH, 320 W | 4159 | 58 | 51 | 0.3799 | 0.3984 | 72 | 1.61 |
| 1.3 | Mercury vapor, 400 W clear | 5891 | 15 | 25 | 0.3191 | 0.4317 | 42 | 1.33 |
| 1.4 | LPS, 180 W | 1785 | −42 | 0 | 0.5681 | 0.4285 | 144 | 0.25 |
| 1.5 | Xenon, 1000 W | 5853 | 97 | 91 | 0.3245 | 0.3439 | 26 | 2.37 |
| 1.6 | White LED, 6500 K | 6528 | 72 | 84 | 0.3116 | 0.3340 | 80 | 2.06 |
| 2.1 | A lamp, 60 W (frosted) | 2764 | 100 | 49 | 0.4555 | 0.4109 | 14 | 1.36 |
| 2.2 | A lamp, 60 W (neodymium doped) | 2789 | 78 | 65 | 0.4460 | 0.3962 | 11 | 1.52 |
| 2.3 | Halogen, 3277 K | 3279 | 100 | 65 | 0.4184 | 0.3969 | 20 | 1.60 |
| 2.4 | CFL, 15 W | 2653 | 83 | 48 | 0.4652 | 0.4141 | 61 | 1.11 |
| 2.5 | Fluorescent, F34T12 cool white | 4022 | 62 | 58 | 0.3833 | 0.3905 | 63 | 1.48 |
| 2.6 | Fluorescent, FO32T8RE835 | 3308 | 86 | 69 | 0.4157 | 0.3939 | 86 | 1.44 |
| 2.7 | Fluorescent, F40T12 daylight | 4861 | 90 | 84 | 0.3502 | 0.3645 | 50 | 1.97 |
| 2.8 | Ceramic MH, 100 W | 4075 | 93 | 80 | 0.3773 | 0.3749 | 66 | 1.79 |
| 2.9 | White LED, 2700 K | 2706 | 84 | 49 | 0.4575 | 0.4072 | 65 | 1.21 |
| 2.10 | White LED, 6500 K | 6528 | 72 | 84 | 0.3116 | 0.3340 | 80 | 2.06 |
| 3.1 | Blue LED, 470-nm peak | N/A | N/A | 4 | 0.1247 | 0.0929 | 10 | 12.79 |
| 3.2 | Fluorescent, F20T12 aquarium lamp | 13408 | 83 | 103 | 0.2676 | 0.2719 | 51 | 2.76 |
| 3.3 | Fluorescent food-display lamp | 3195 | 61 | 128 | 0.3869 | 0.3153 | 36 | 1.97 |

FIG._5A (RELATED ART)

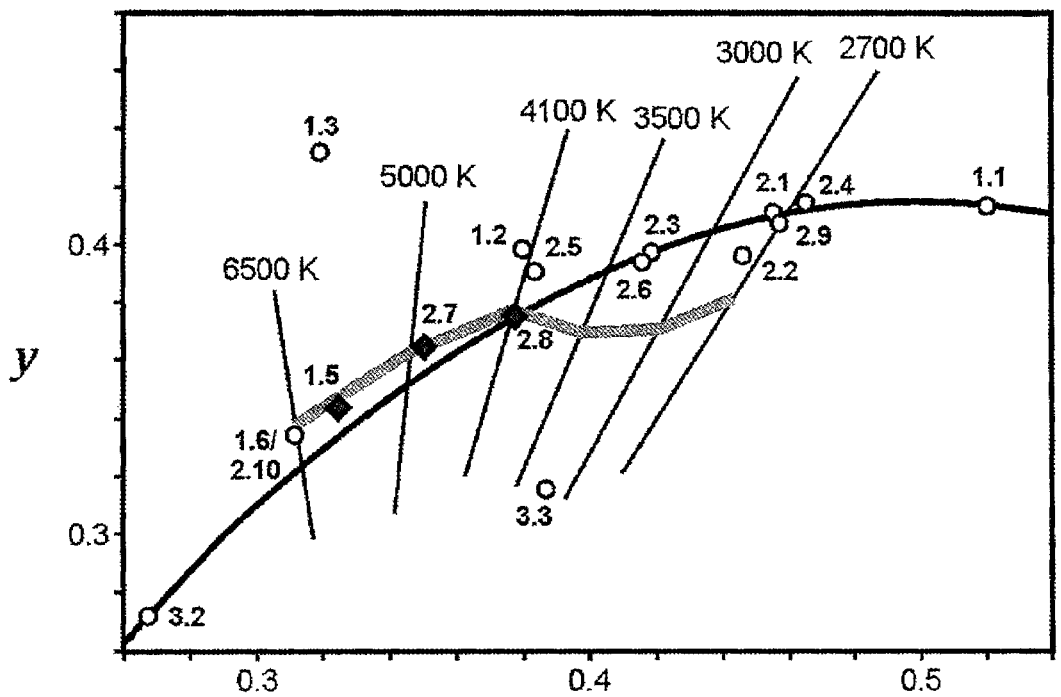

FIG._5B (RELATED ART)

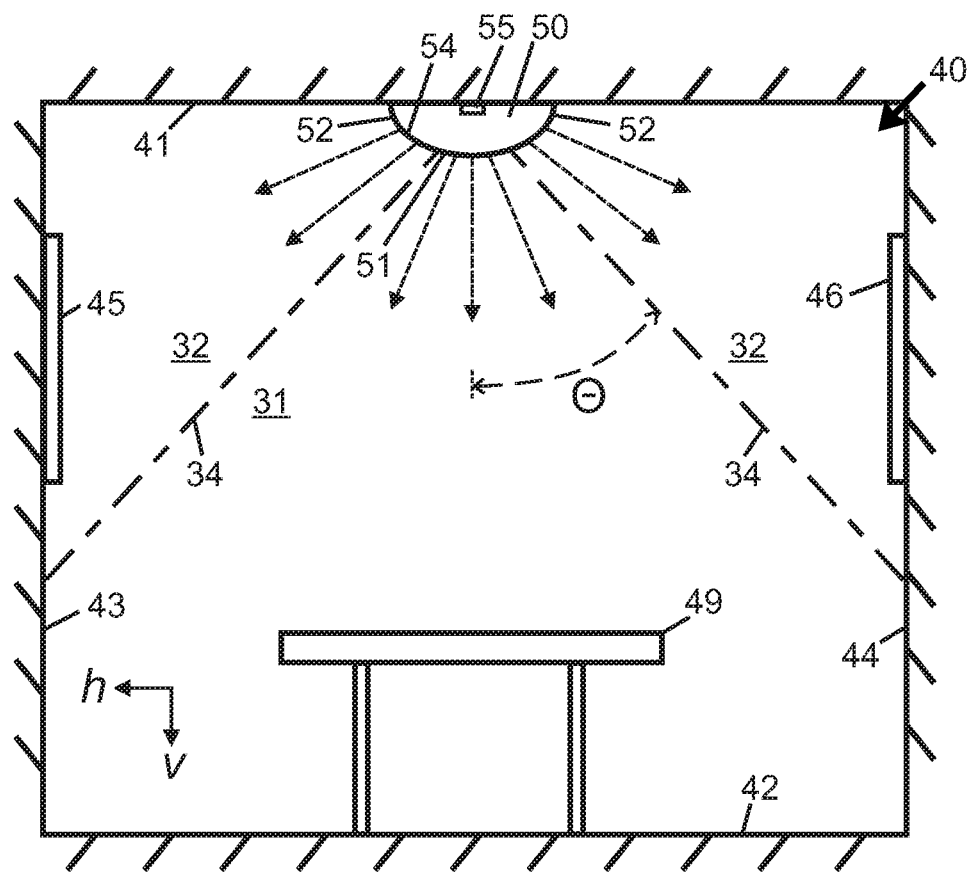
FIG._6A
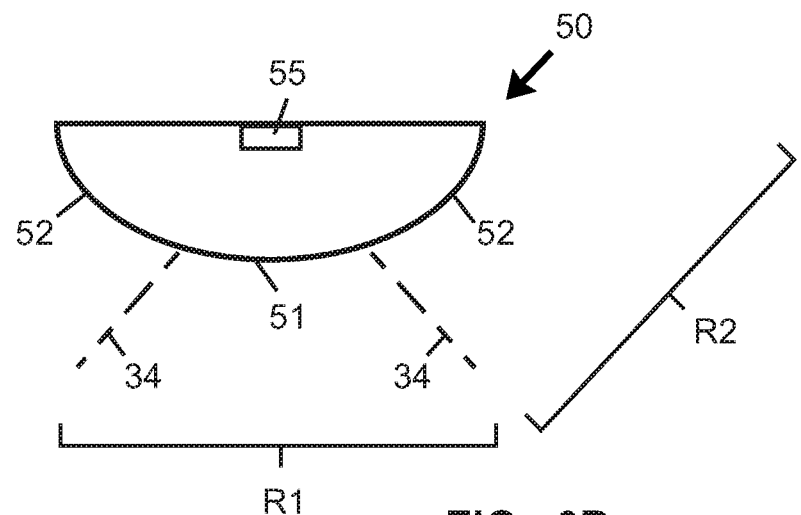
FIG._6B

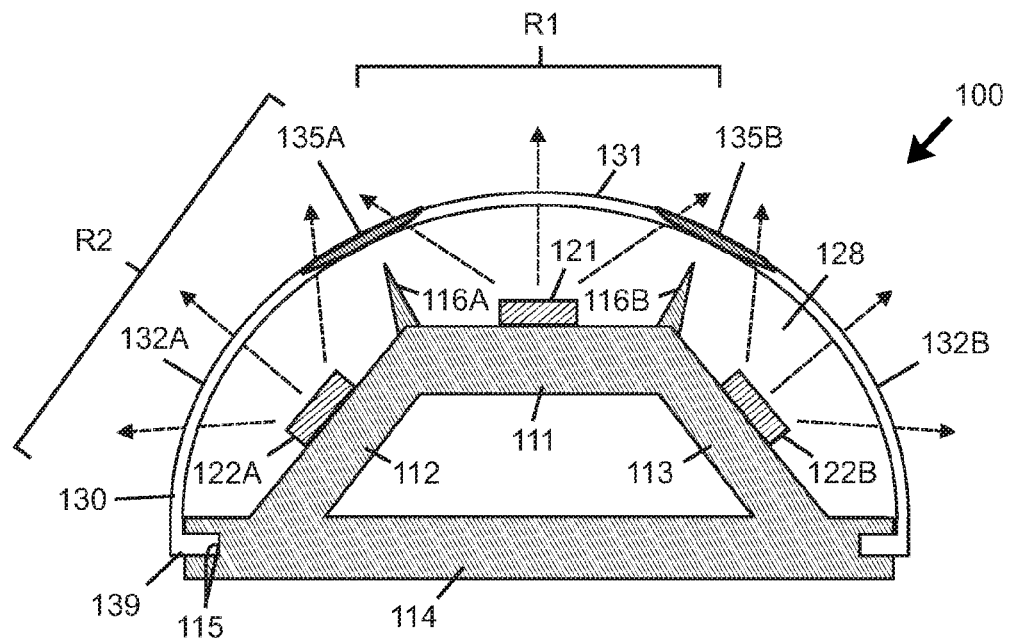
FIG. _7
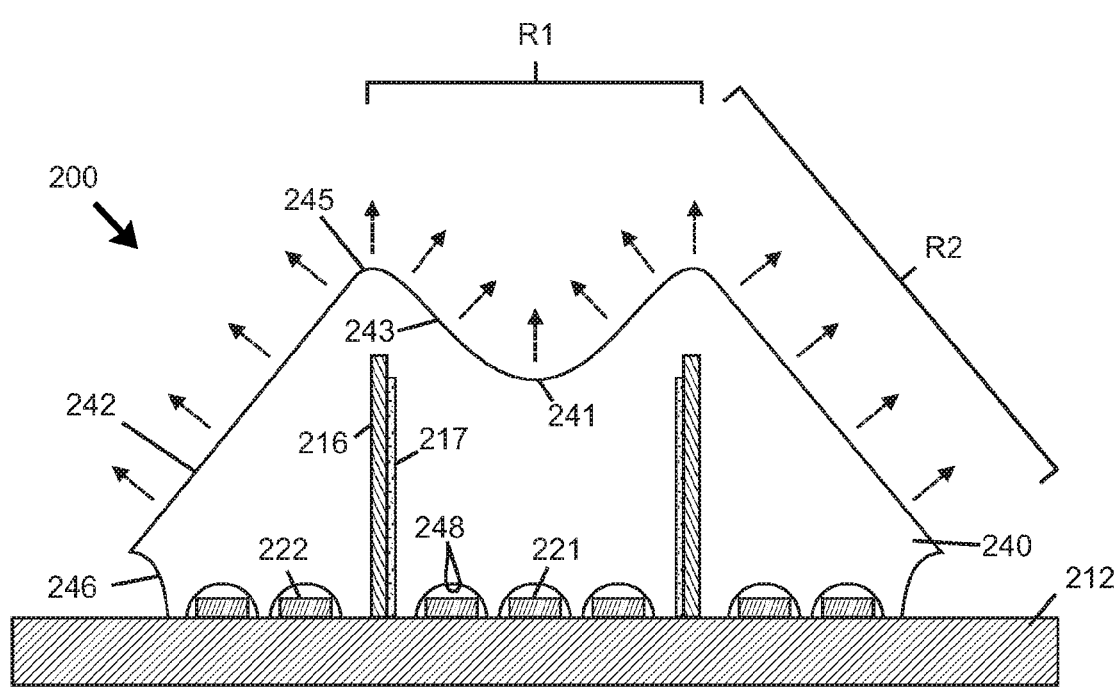
FIG. _8

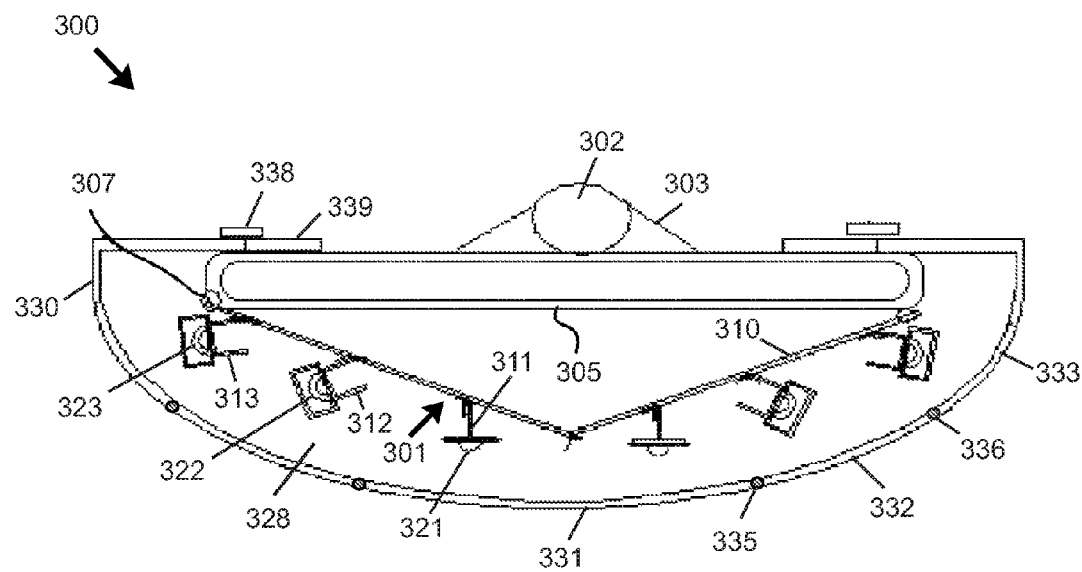
FIG._9
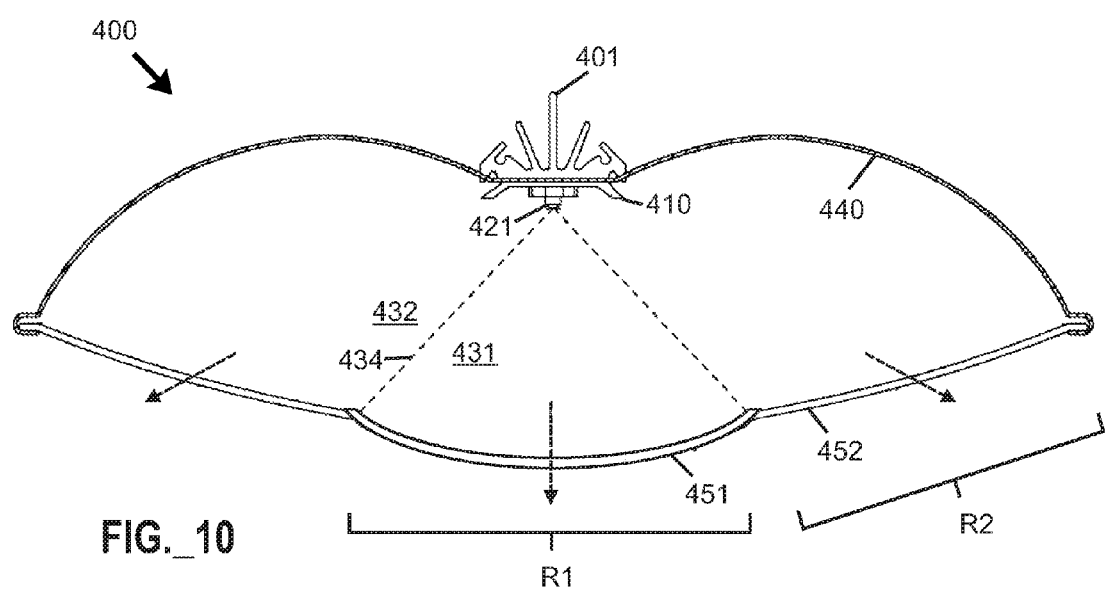
FIG._10

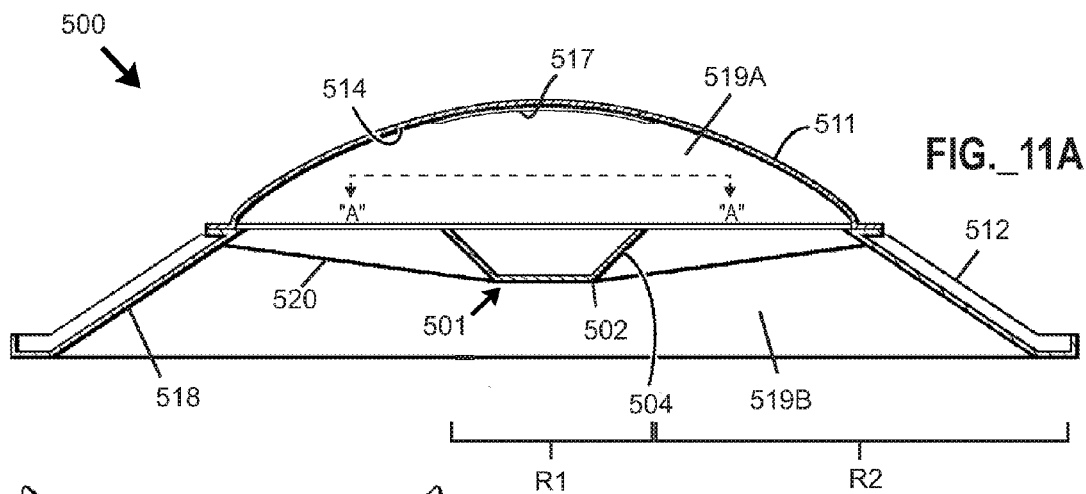
FIG._11A
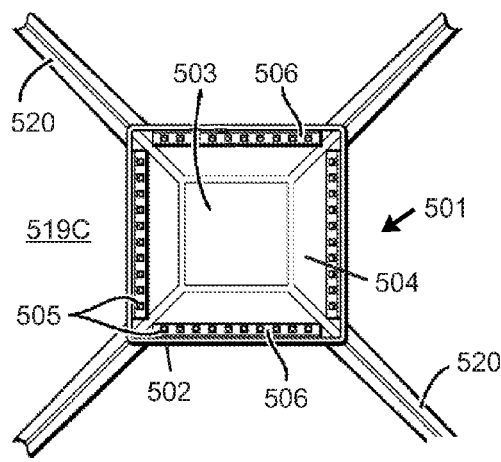
FIG._11B
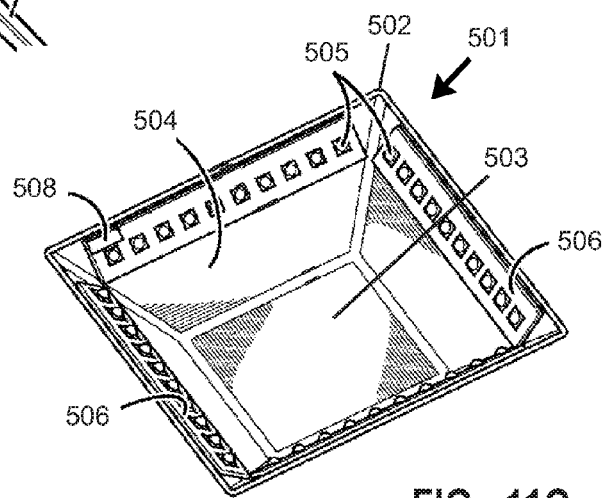
FIG._11C

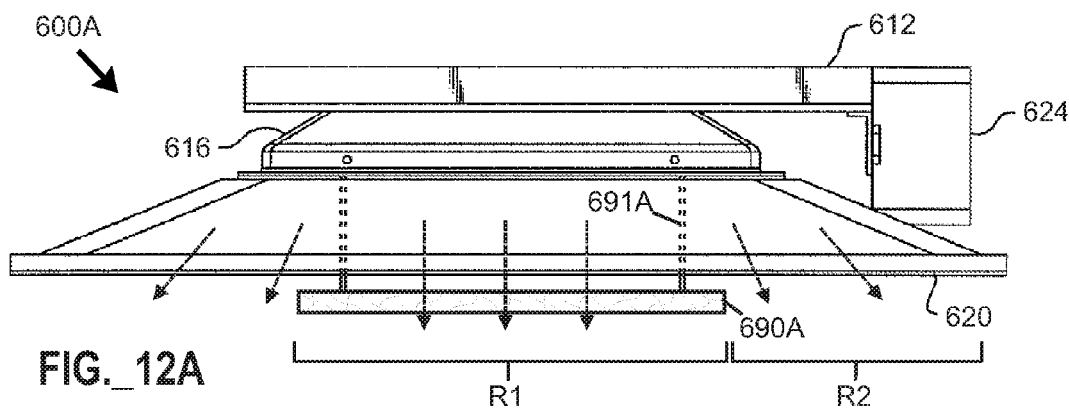
FIG._12A
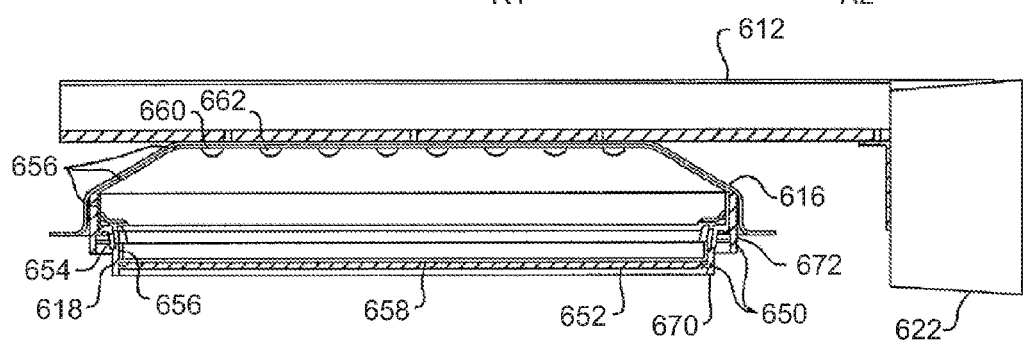
FIG._12B
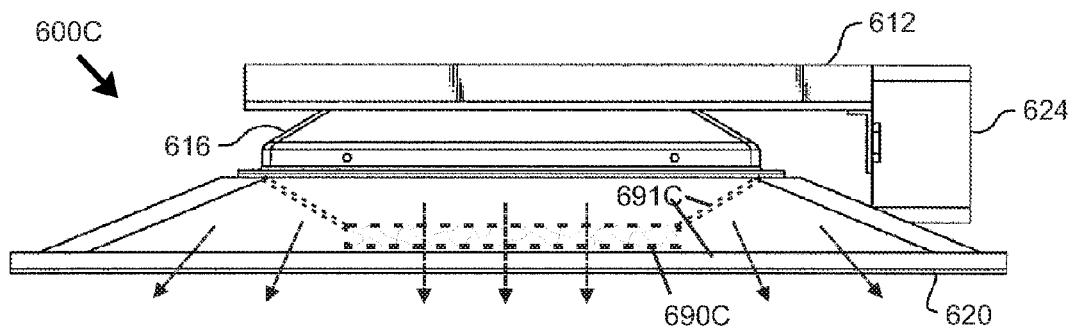
FIG._12C
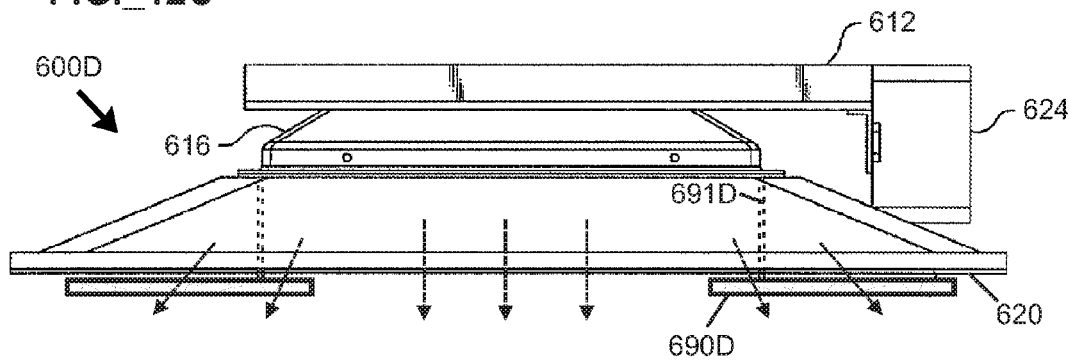
FIG._12D

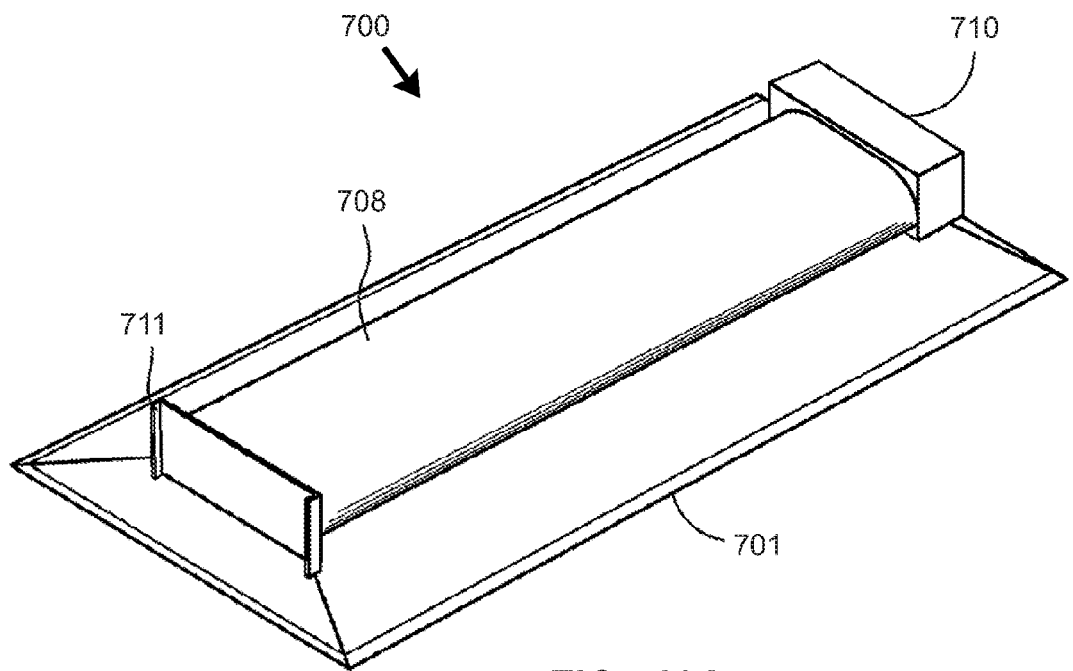
FIG._13A
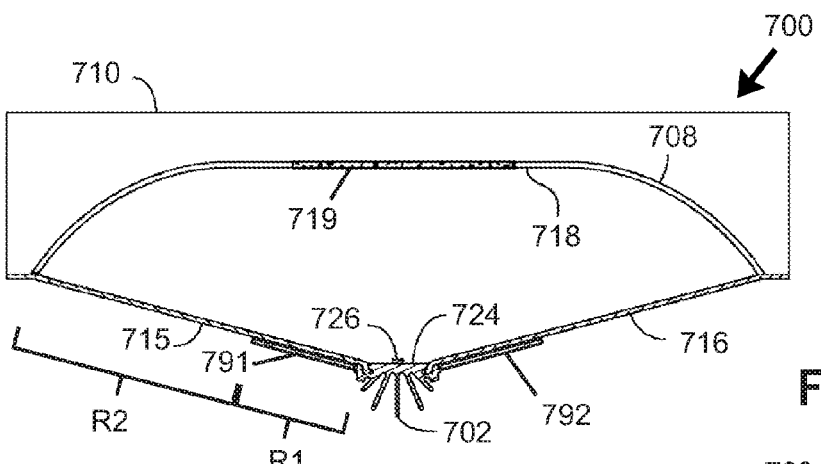
FIG._13B
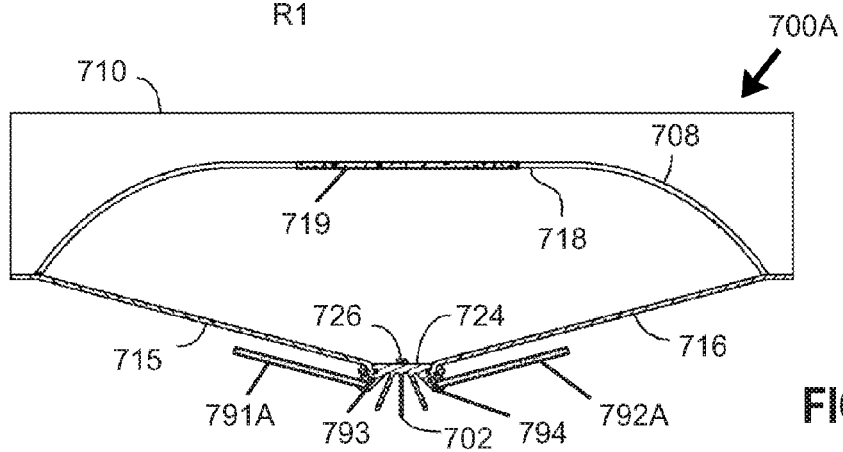
FIG._13C

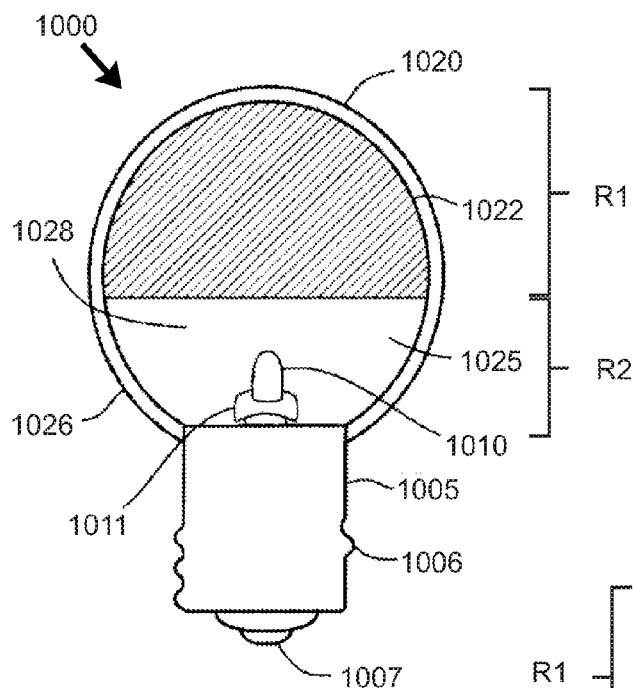
FIG._16
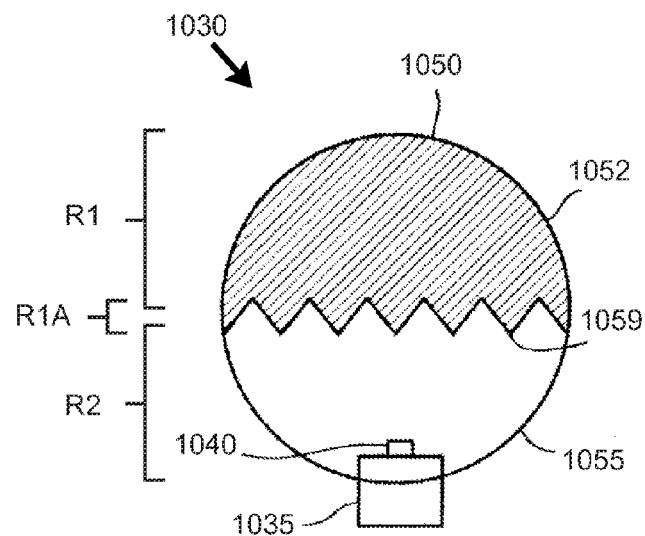
FIG._17
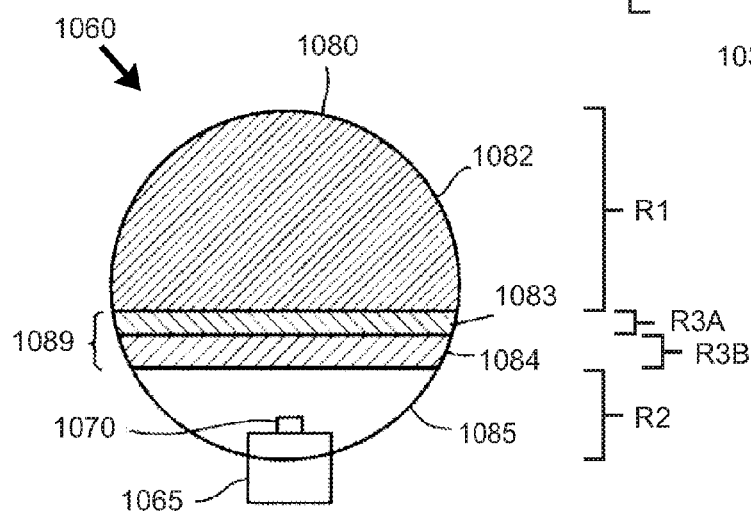
FIG._18

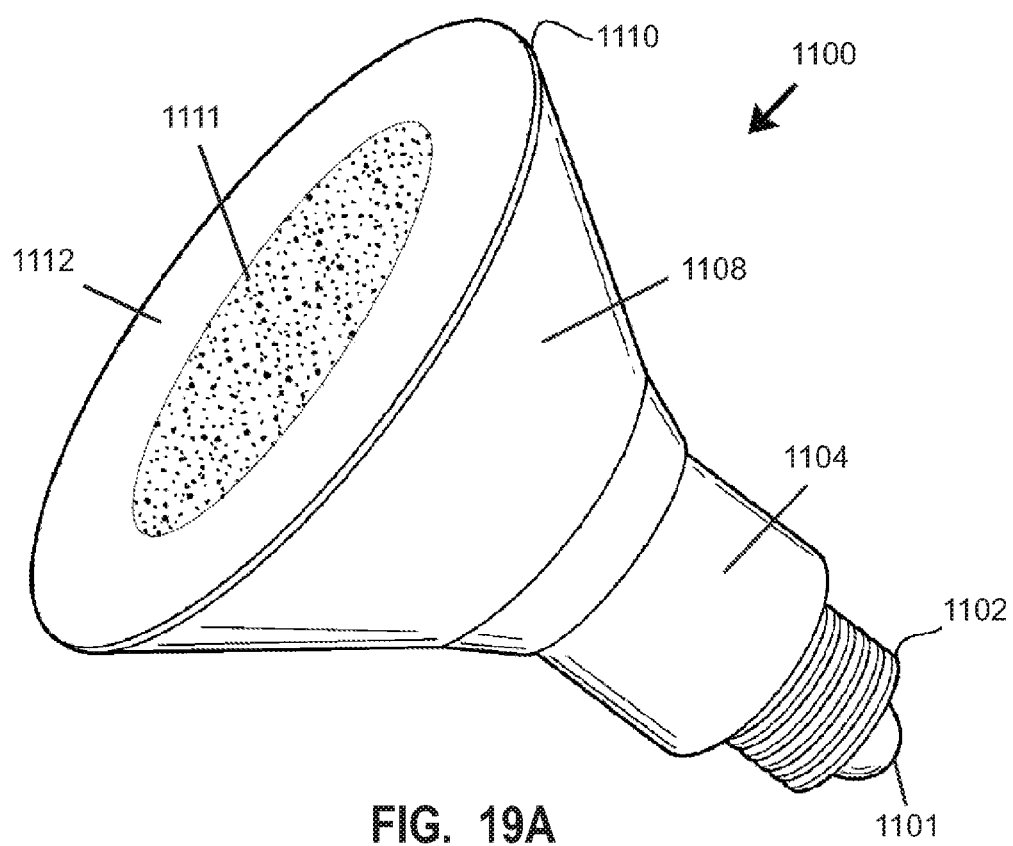
FIG._19A
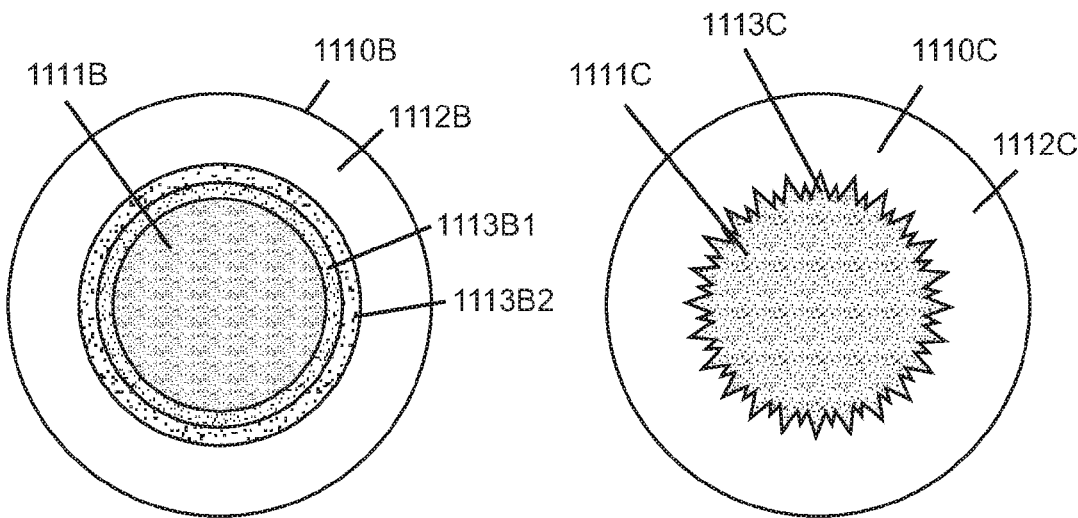
FIG._19B  FIG._19C

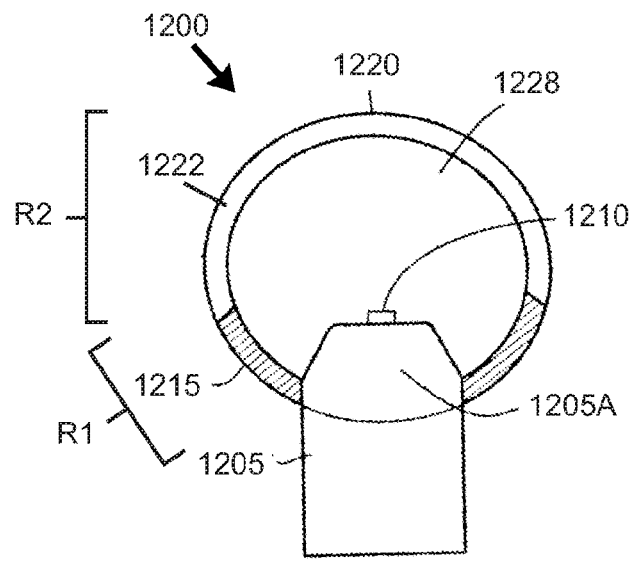
FIG._20
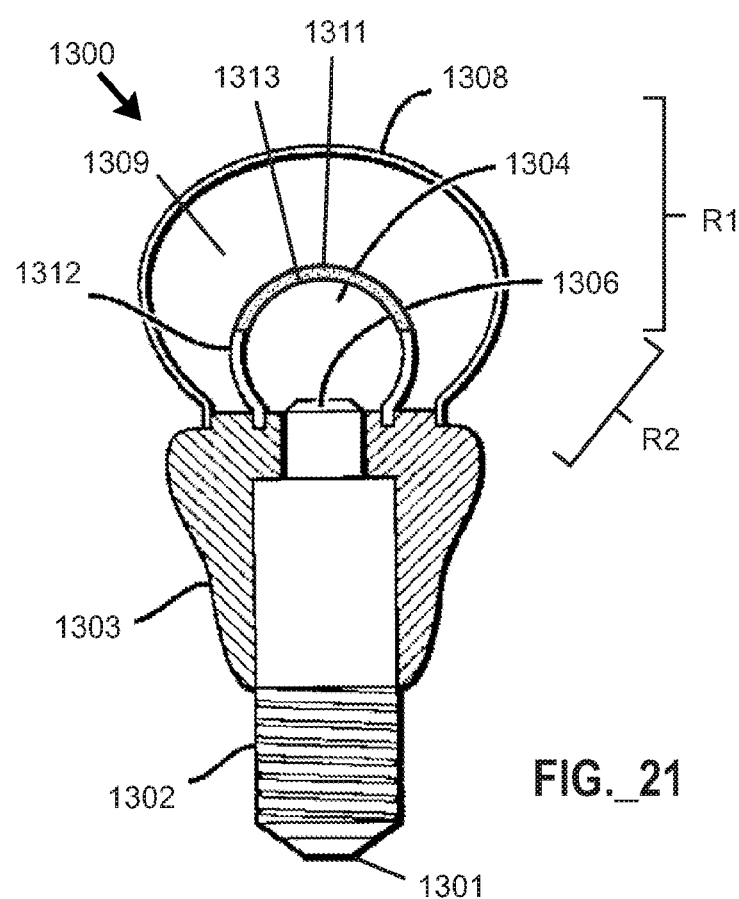
FIG._21

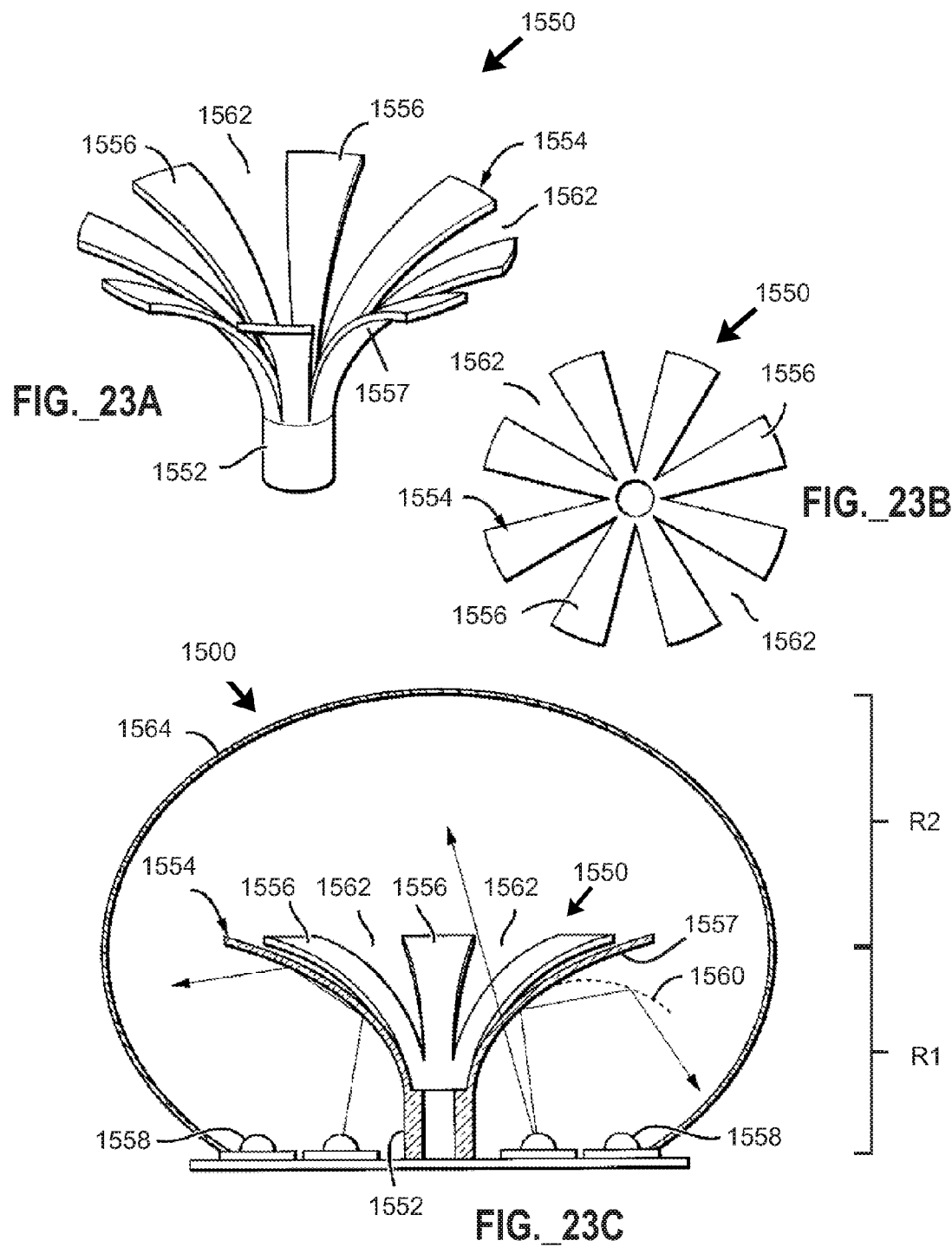

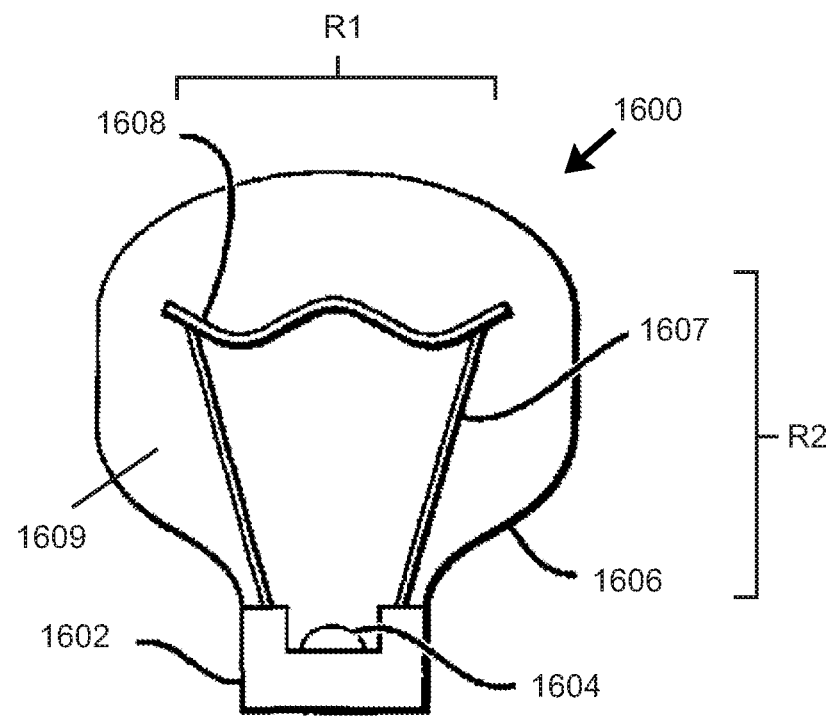
FIG._24
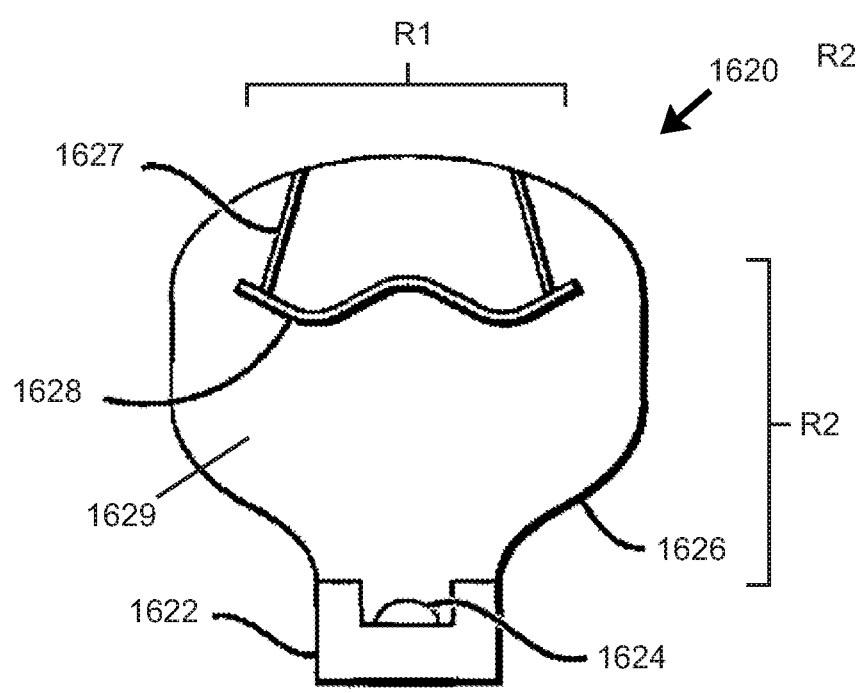
FIG._25

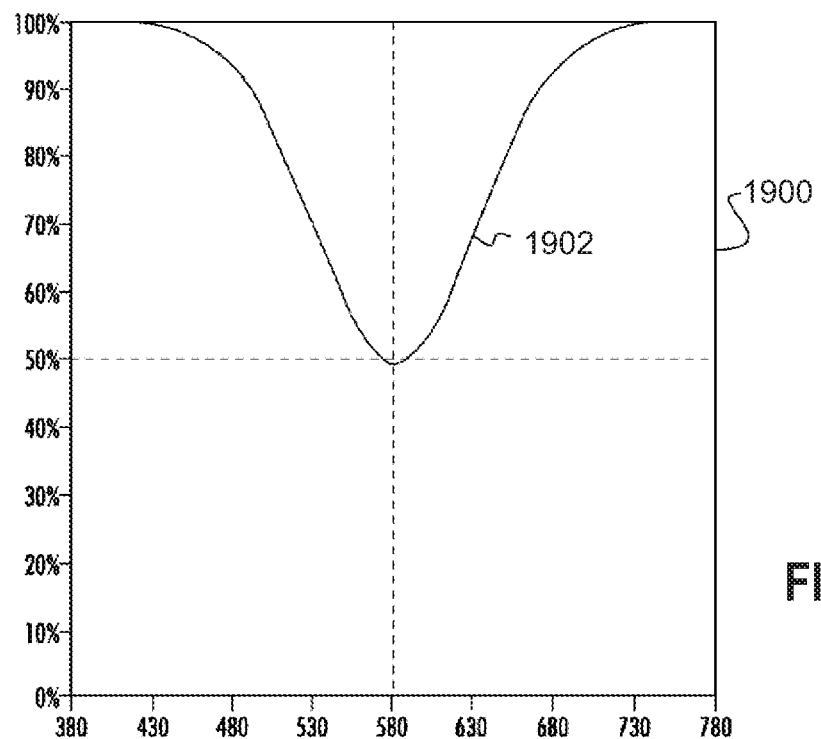
FIG._28

LIGHTING DEVICES WITH ILLUMINATION REGIONS HAVING DIFFERENT GAMUT PROPERTIES

TECHNICAL FIELD

Subject matter herein relates to lighting devices, including specific embodiments directed to systems and methods utilizing one or more electrically activated state emitters, and relates to associated methods of making and using lighting devices.

BACKGROUND

Various types of lighting technologies are known, including incandescent, fluorescent, high intensity discharge, and solid state sources. Solid state emitters such as light-emitting diodes (LEDs) or lasers may be used to provide white light (e.g., perceived as being white or near-white), and are increasingly attractive as replacements for incandescent lamps. Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or by emissions of a blue emitting LED in combination with a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or ultraviolet (UV) LED source.

Emissions of a blue LED in combination with a yellow or green lumiphoric material may be near-white in character and referred to as "blue-shifted yellow" (BSY) light or "blue-shifted green" (BSG) light. Addition of red spectral output from a red-emitting LED (to yield a BSY+R device) or from a red lumiphoric material (to yield a BS(Y+R) device) may be used to increase the warmth of the aggregated light output and better approximate light produced by incandescent lamps.

It is known to enclose a LED chip in a package to provide environmental and/or mechanical protection, color selection, light focusing and other functions. A LED package also includes electrical leads, contacts, and/or traces for electrically connecting the LED package to an external circuit. A conventional two-pin LED package/component 10 is illustrated in FIG. 1, including a single LED chip 12 mounted on a reflective cup 13 with a solder bond or epoxy (which may be conductive). One or more wire bonds 11 may connect the ohmic contacts of the LED chip 12 to leads 15A and/or 15B, which may be attached to or integrated with the reflective cup 13. The LED package illustrated in FIG. 1 may include a vertically oriented LED chip 12 with a conductive growth substrate (p-side up in a group III-nitride LED) or conductive carrier substrate (n-side up) and one wire bond 11. In alternative implementations, a LED component may include a laterally oriented LED chip on an insulating substrate with two wire bonds 11. In other implementations involving use of one or more "flip" chips, the need for wire bonds 11 may be eliminated. A transparent encapsulant material 16 may be provided in the reflective cup 13. A wavelength conversion material, such as a phosphor or other lumiphoric material, may be mixed with the encapsulant or otherwise arranged over the LED chip 12. Light emitted by the LED at a first wavelength may be absorbed by the wavelength conversion material, which may responsively emit light at a second wavelength. The assembly can be further covered with a clear protective resin 14, which may be molded in the shape of a lens to direct or shape the light emitted by the LED chip 12 and/or wavelength conversion material.

Another conventional LED package 20 is illustrated in FIG. 2, with the LED package 20 being suitable for high power operations with increased thermal dissipation requirements. One or more LED chips 22 are mounted over a carrier such as a printed circuit board (PCB) carrier, substrate, or submount 23, which may include ceramic material. The LED package 20 may include one or more LED chips 22 of any suitable spectral output (e.g., ultraviolet, blue, green, red, white (such as may include a blue LED chip and one or more phosphors) and/or other colors). A reflector 24 may be mounted on the submount 23 to surround the LED chips 22 to reflect light emitted by the LED chips 22 away from the LED package 20, and to provide mechanical protection to the LED chips 22. One or more wirebond connections 21 may be made between ohmic contacts on the LED chips 22 and electrical traces 25A, 25B on the submount 23. The LED chips 22 are covered with a transparent encapsulant material 26, which may provide protection and/or light shaping utility.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. CRI Ra is a modified average utilizing the first eight indices, all of which have low to moderate chromatic saturation (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source.

Gamut Area Index (GAI) is a convenient way of characterizing in chromaticity space how saturated the illumination makes objects appear, with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a gamut area index of approximately 50% (i.e., about half the gamut area of the EES source). Sources with higher CCT values have a larger GAI. For example, a very bluish light with a CCT of 10,000K may have a GAI of 140%.

Another way of characterizing how saturated an illuminant makes objects appear is relative gamut area, or $Q_g$, which is the area formed by the (a*, b*) coordinates of the 15 test-color samples in CIELAB normalized by the gamut area of a reference illuminant at the same CCT and multiplied by 100. Like GAI, $Q_g$ values can exceed 100. Because of chromatic adaptation, and because CCT is selected to set the overall color tone of an environment as part of the lighting design process, variable-reference measures such as $Q_g$ may be especially relevant to applied lighting design. If the relative gamut is greater than that of the reference, and illuminance is lower than that provided by daylight, then an increase in preference and discrimination might be expected relative to the reference at that same CCT. Conversely, if the relative gamut is smaller than that of the reference, then a decrease in preference and discrimination might be expected relative to the reference at the same CCT.

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature in Kelvin (K). Practical materials that incandesce are said to have CCT values that are directly related to color temperatures of blackbody sources. CCT is intended to characterize the apparent "tint" of the illumination (e.g., warm or cool) produced by an electric light source. Certain implicit assumptions are embedded in this CCT designation—such as the assumption that chromaticities along the line of blackbody radiation are perceived as "white", and that a CCT designation for a manufactured light source implies consistency in chromaticities of all sources having that designation. Recent research suggests, however, that most sources with chromaticities along the line of blackbody radiation do not appear "white"; rather, such sources provide illumination with discernible tint. An empirically established line of minimum tint in CIE 1931 (x,y) chromaticity space for CCTs between 2700K and 6500K is shown in FIG. 3. Researchers have determined that a majority of people prefer sources of illumination on this "white body line" (i.e., line of minimum tint) more than those of the same CCT line of blackbody radiation. (See, e.g., Rea, M. S. and Freyssinier, J. P.: White lighting for residential applications, Light Res. Tech., 45(3), pp. 331-344 (2013).) As shown in FIG. 3, at CCT values below about 4000K, the "white body line" (WBL) is below the blackbody curve, whereas at higher CCT values, the WBL is above the blackbody curve.

Rea and Freyssinier have proposed that lighting could be generally improved by ensuring that its CRI Ra value is at least 80 while its GAI is in a range of from 80 to 100 (i.e., from 80% to 100% of an EES), such as represented by the shaded region in FIG. 4.

Characteristics including CCT, CRI Ra, GAI, CIE 1931 (x,y) coordinates, luminous efficacy (lm/W), and scotopic/photopic (S/P) ratios for eighteen different light sources are tabulated in FIG. 5A, and chromaticities for selected sources of the foregoing eighteen light sources are plotted in FIG. 5B together with the blackbody curve and the WBL (line of minimum tint). (Source: "Value Metrics for Better Lighting," Rea, Mark S., et al., 2013, pp. 54 & 63, SPIE Press (Bellingham, Wash., US), ISBN 978-0-8194-9322-4.) As indicated in FIG. 5A, the ability of artificial lights to accurately illuminate color objects, as well as the gamut area provided by artificial lights, varies enormously by type.

Solid state emitters such as LEDs, in combination with lumiphors, create white light by mixing relatively narrow wavelength bands together with spectral gaps between peaks of LEDs and/or lumiphors. The resulting light may be under-saturated with certain colors of the spectrum or over-saturated with certain colors. One way to alleviate oversaturation with respect to certain portions of the visible spectrum, and thereby improve CRI, includes notch filtering of LED lighting systems with an optical element (e.g., incorporating a rare earth compound such as neodymium oxide, or a color pigment) that filters light emissions so that light passing through or reflected by the optical element exhibits a spectral notch, as disclosed in U.S. Patent Application Publication No. 2013/0170199 A1 entitled "LED lighting using spectral notching" (which is hereby incorporated by reference herein). Such publication discloses that CRI and GAI values of LED light sources can be improved through use of notch filtering, such as to increase CRI from 84 to 90, and to increase GAI from 50 to 58. Alternatively, careful selection of materials used in LED lighting devices may permit attainment of CRI Ra values of 90 to 95 or more, as disclosed in U.S. Pat. No. 7,213,940 (which is hereby incorporated by reference).

Usage of notch filtered light sources (such as widely available General Electric Reveal® incandescent light bulbs) or unfiltered light sources may be a matter of personal preference. Additionally, such preference may depend on the object(s) or surfaces to be illuminated, and/or the presence or absence of natural light such as may enter an interior space through one or more windows at certain times of day. It can be challenging to accommodate context-dependent and/or surface-dependent preferences when selecting artificial light sources. It can also be challenging to vividly illuminate objects without causing adjacent surfaces, such as walls, to be illuminated with an unnatural tint.

The art continues to seek improved lighting devices providing desirable illumination characteristics that are capable of overcoming challenges associated with conventional lighting devices.

SUMMARY

The present disclosure relates in various aspects to lighting devices with multiple light-emitting regions to transmit or reflect emission portions having different gamut properties (e.g., gamut area index (GAI) values differing by at least 10%, by at least 15%, or another threshold disclosed herein, or relative gamut ($Q_g$) values differing by at least 5%, by at least 10%, by at least 15%, or another threshold disclosed herein). In certain aspects, different light-emitting regions may be arranged to transmit emission portions or light beams having different GAI or $Q_g$ values in different directions (e.g., a vertical direction and a horizontal direction, or another combination of directions), such as may include a first beam or group of beams centered in a first direction, and a second beam or group of beams centered in a second direction that differs from the first direction. In certain aspects, different light-emitting regions may include one or more light-affecting materials arranged to differently transmit or reflect light. The present disclosure relates in further aspects to lighting devices with multiple electrically activated light emitters having different gamut properties (e.g., GAI values differing by at least 10%, by at least 15%, or another threshold disclosed herein, or $Q_g$ values differing by at least 5%, by at least 10%, by at least 15%, or another threshold disclosed herein), wherein emitters or groups of emitters with different gamut properties are arranged to illuminate different regions of a light output surface or area of the lighting device. In certain aspects, a first emitter or emitter group (e.g., arranged to produce a first mixture of light including a first color point) and a second emitter or emitter group (e.g., arranged to produce a second mixture of light including a second color point) may be separately arranged to produce white light with different gamut areas and/or relative gamut values, and the different mixtures of light may be transmitted or reflected in different directions. A color point of one or more beams or emission portions having different gamut properties of a lighting device may be on or proximate to the blackbody locus or the white body line (or line or minimum tint). In certain aspects, electrically activated emitters may include solid state emitters, such as light-emitting diodes (LEDs), optionally arranged to stimulate emissions of one or more lumiphoric materials. A lighting device with different gamut regions may preferably be devoid of any non-lumiphor-converted electrically activated solid state blue light emitter.

In one aspect, a lighting device includes: at least one electrically activated light emitter; a first light-emitting region arranged to transmit or reflect at least a first portion of emissions of the least one electrically activated light emitter in a first direction, wherein the at least a first portion of emissions comprises a first GAI value; and a second light-emitting region arranged to transmit or reflect at least a second portion of emissions of the least one electrically activated light emitter in a second direction, wherein the at least a second portion of emissions comprises a second GAI value; wherein the second GAI value differs from the first GAI value by at least 10%. In certain aspects, the preceding GAI threshold may be replaced with one or more $Q_g$ values or other GAI values as disclosed herein.

In another aspect, a lighting device includes: at least one first electrically activated light emitter arranged to produce, in the absence of any additional light, emissions having a first gamut area index (GAI) value; and at least one second electrically activated light emitter arranged to produce, in the absence of any additional light, emissions having a second gamut area index (GAI) value, wherein the second GAI value differs from the first GAI value by at least 10%; wherein the at least one first electrically activated emitter is arranged to illuminate a first region of a light output surface or area of the lighting device; and wherein the at least one second electrically activated emitter is arranged to illuminate a second region of a light output surface or area of the lighting device. In certain aspects, the preceding GAI threshold may be replaced with one or more $Q_g$ values or other GAI values as disclosed herein.

In another aspect, the present disclosure relates to a retrofit element for a lighting device that includes a light output surface or area, the retrofit element including an attachment structure arranged for removable attachment to the lighting device, and a light-affecting material supported by the attachment structure and arranged to span across a portion of the light output surface or area, wherein the light-affecting material is arranged to receive emissions from the lighting device having a first GAI value, interact with the received emissions to produce gamut-altered emissions having a second GAI value by at least 10%, and transmit the gamut-altered emissions to exit the retrofit element. In certain aspects, the preceding GAI threshold may be replaced with one or more relative gamut ($Q_g$) values or other GAI values as disclosed herein.

In additional aspects, the present disclosure relates to light fixtures and light bulbs incorporating lighting devices or retrofit elements as described herein.

In another aspect, the present disclosure relates to a method comprising illuminating an object, a space, or an environment, utilizing a solid state lighting device, or utilizing a lighting device and retrofit element, as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional view of a first conventional LED package.

FIG. 2 is a side cross-sectional view of a second conventional LED package.

FIG. 3 is an excerpt of a CIE 1931 chromaticity diagram showing the blackbody locus and including a line of minimum tint (or "white body line") extending between CCT values of from 2700K to 6500K.

FIG. 4 is a two dimensional plot of gamut area index (GAI) and average color rendering index (CRI Ra) including a shaded region at upper right representing a preferred combination of CRI Ra≥80 and 80≤GAI≤100.

FIG. 5A is a chart including CCT, CRI Ra, GAI, CIE 1931 (x,y) coordinates, luminous efficacy (lm/W), and scotopic/photopic (S/P) ratios for eighteen different light sources.

FIG. 5B is an excerpt of a CIE 1931 chromaticity diagram showing the blackbody locus, the line of minimum tint (or "white body line") extending between CCT values from 2700K to 6500K, and (x,y) coordinate plots for selected sources of the eighteen light sources listed in FIG. 5A.

FIG. 6A is a schematic elevation view of an interior space including an overhead (e.g., ceiling-mounted) electrically activated light source arranged to illuminate an indoor environment with light beams propagating in different directions, and with dashed lines demarking regions having different gamut properties (e.g., gamut area and/or relative gamut values).

FIG. 6B is a schematic elevation view of the overhead electrically activated light source depicted in FIG. 6A.

FIG. 7 is a side cross-sectional view of at least a portion of a lighting device including electrically activated light sources (e.g., preferably having different gamut properties) oriented on differently-angled surfaces of a support structure to emit beams in different directions, with light transition regions and/or light blocking elements arranged between adjacent light sources.

FIG. 8 is a side cross-sectional view of at least a portion of a lighting device including groups of electrically activated light sources (e.g., preferably having different gamut properties between groups thereof) oriented on different portions of a substantially planar substrate, with transition/light blocking elements and/or light-affecting materials arranged between adjacent groups of light sources, and with at least one optical element arranged to direct at least substantial portions of emissions of different light source groups in different directions.

FIG. 9 is a side cross-sectional view of at least a portion of a lighting device including electrically activated light sources (e.g., preferably having different gamut properties) arranged to emit light in different directions.

FIG. 10 is a side cross-sectional view of at least a portion of a direct emission lighting device including at least one transmissive light-affecting region and arranged to output light with different gamut properties in different directions.

FIG. 11A is a side cross-sectional view of at least a portion of a reflected emission lighting device including one or more light-affecting regions (e.g., providing filtering and/or wavelength conversion utility) to yield light output regions arranged to output light with different gamut properties in different directions.

FIG. 11B is a top plan view of a portion of the lighting device of FIG. 11A taken along view lines "A"-"A".

FIG. 11C is an upper perspective view of a sub-portion of the lighting device of FIG. 11A and portion of FIG. 11B.

FIG. 12A is a side elevation view of a direct emission lighting device including a centrally arranged light-affecting element disposed outside a reflector cavity to affect a central portion of emissions of the lighting device.

FIG. 12B is a side elevation magnified view of a portion of the lighting device of FIG. 12A.

FIG. 12C is a side elevation view of another direct emission lighting device similar to FIG. 12A but including a centrally arranged light-affecting element disposed outside a reflector cavity to affect a central portion of emissions of the lighting device.

FIG. 12D is a side elevation view of another direct emission lighting device similar to FIG. 12A but including a peripherally arranged light-affecting element disposed outside a reflector cavity to affect a peripheral portion of emissions of the lighting device.

FIG. 13A is an upper perspective view of a reflected emission lighting device.

FIG. 13B is a side cross-sectional view of a portion of a reflected emission lighting device consistent with FIG. 13A, with the lighting device including a centrally arranged light-affecting element positioned in or on a reflector, and including medially arranged light-affecting elements positioned in or along light-transmissive plates.

FIG. 13C is a side cross-sectional view of a portion of a reflected emission lighting device consistent with FIG. 13A, with the lighting device including one or more light-affecting elements positioned in or on a reflector, and including centrally or medially arranged light-affecting elements mounted to heatsink and/or trim structures.

FIG. 16 is an elevation view of a lighting device embodied in a light bulb including a centrally arranged light-affecting region arranged in or on a hemispherical globe, with an abrupt transition between the centrally arranged light-affecting region and a peripheral region.

FIG. 17 is an elevation view of a lighting device embodied in a light bulb including a centrally arranged light-affecting region arranged in or on a hemispherical globe, with a sawtooth or feathered transition between the centrally arranged light-affecting region and a peripheral region.

FIG. 18 is an elevation view of a lighting device embodied in a light bulb including a centrally arranged light-affecting region arranged in or on a hemispherical globe, with a stepped or gradient transition between the centrally arranged light-affecting region and a peripheral region.

FIG. 19A is a perspective view of a lighting device embodied in a reflector-type light bulb including a centrally arranged light-affecting region arranged in or on a lens or cover portion of the bulb.

FIG. 19B is a top plan view of a circular lens or cover portion of a light bulb including a centrally arranged light-affecting region disposed therein or thereon, with a stepped or gradient transition between the centrally arranged light-affecting region and a peripheral region.

FIG. 19C is a top plan view of a circular lens or cover portion of a light bulb including a centrally arranged light-affecting region disposed therein or thereon, with a sawtooth or feathered transition between the centrally arranged light-affecting region and a peripheral region.

FIG. 20 is a simplified side cross-sectional view of at least a portion of a lighting device embodied in a light bulb including a peripherally arranged light-affecting region disposed in or on a hemispherical cover or globe.

FIG. 21 is a side cross-sectional view of a lighting device embodied in a light bulb including a centrally arranged light-affecting region disposed within or under a hemispherical cover or globe.

FIG. 23A is a perspective view of a non-planar, substantially flower-shaped light-affecting structure arranged to be positioned between electrically activated light emitters and a lens or diffuser of a lighting device.

FIG. 23B is a top plan view of the light-affecting structure of FIG. 23A.

FIG. 23C is a side cross-sectional view of at least a portion of a lighting device including the light-affecting structure of FIGS. 23A-23B positioned between electrically activated light emitters and a lens or diffuser.

FIG. 24 is a side cross-sectional view of at least a portion of another lighting device including a base-supported centrally arranged light-affecting structure arranged to be positioned between electrically activated light emitters and a lens or diffuser.

FIG. 25 is a side cross-sectional view of at least a portion of another lighting device including a lens- or diffuser-supported centrally arranged light-affecting structure arranged to be positioned between electrically activated light emitters and a lens or diffuser.

FIG. 28 depicts spectral transmittance versus wavelength for an illustrative color pigment material.

DETAILED DESCRIPTION

Figure 14:
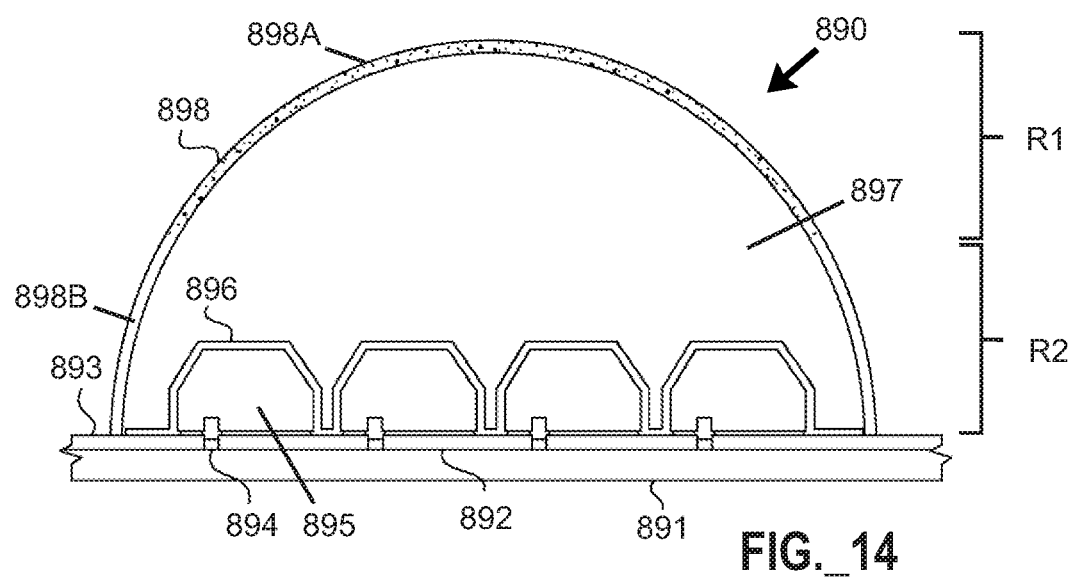
FIG. 14 is a side cross-sectional view of a lighting device embodying an emitter package including a dome-type lens with a centrally arranged light-affecting element.

As noted previously, the art continues to seek lighting devices providing desirable illumination characteristics. Subject matter disclosed herein relates to lighting devices arranged to transmit or reflect emission portions having different gamut properties in different directions (e.g., with different beams or groups of beams centered in different directions), and/or to illuminate different light output surfaces or areas of a lighting device. Such different gamut properties may include gamut area index (GAI) values differing by at least 10%, by at least 15%, or another threshold disclosed herein, and/or relative gamut ($Q_g$) values differing by at least 5%, by at least 10%, by at least 15%, or another threshold disclosed herein. Emission portions having different gamut properties may be attained in different ways, including use of electrically activated emitters having different gamut properties, and/or use of light-affecting materials (e.g., filters, pigments, lumiphors, and the like) having different gamut properties and applied to emitters, reflectors, or light-transmissive elements. Different presence, amount, and/or patterning may be used to adjust light-affecting characteristics of one or more light-affecting materials.

Subject matter disclosed herein also relates to retrofit elements for lighting devices, with an exemplary retrofit element including an attachment structure arranged for removable attachment to a light device, and a light-affecting material supported by the attachment structure and arranged to span across a portion of a light output surface or area of the lighting device, wherein the light-affecting material is arranged to receive emissions from the lighting device having a first gamut property, interact with the received emissions to produce gamut-altered emissions having a second gamut property that differs from the first gamut property, and transmit the gamut-altered emissions to exit the retrofit element. In certain embodiments, such different gamut properties may include GAI values differing by at least 10%, by at least 15%, or another threshold disclosed herein, and/or $Q_g$ values differing by at least 5%, by at least 10%, by at least 15%, or another threshold disclosed herein Propagation of emission portions having different gamut properties in different directions, and/or illumination of different light output surfaces or areas of a lighting device, enables different illumination of different elements and/or surfaces in an environment using a single lighting device. For example, it may be desirable in a retail setting or office setting to cause objects displayed on tabletops to have vivid color (e.g., with high gamut) in order to increase their attractiveness, but it may not be desirable to illuminate walls in a similar manner since wall surfaces may attain an unnatural tint. Numerous other settings may benefit from the ability to direct light with higher GAI and $Q_g$ values in one direction and to direct light with lower GAI and $Q_g$ in another direction using a single lighting device.

In certain embodiments, emitters having different gamut properties may be arranged on different (e.g., non-coplanar) support surfaces and aimed or oriented in different directions to cause beams or emission portions having different gamut properties to be cast in different directions when exiting a lighting device. In certain embodiments, different gamut properties may be obtained by adding notch filtering material to one or more emitters. In certain embodiments, different gamut properties may be obtained by adding different lumiphoric materials (e.g., phosphors) to different emitters. For example, a blue-shifted green emitter (e.g., blue LED arranged to stimulate a lumiphor having a dominant wavelength in the green range) may exhibit an increased gamut property relative to a blue emitter (e.g., blue LED) or blue-shifted yellow emitter (e.g., blue LED arranged to stimulate a lumiphor having a dominant wavelength in the yellow range). Other methods may be used to provide electrically activated emitters having different gamut properties in a single lighting device.

In certain embodiments, a lighting device includes at least one first electrically activated light emitter (e.g., arranged to illuminate a first light emitting region of the lighting device) and at least one second electrically activated light emitter (e.g., arranged to illuminate a second light emitting region of the lighting device), wherein the at least one first electrically activated light emitter is arranged to produce spectral output having a GAI (or $Q_g$) value that exceeds a corresponding GAI (or $Q_g$) value of spectral output produced by the at least one second electrically activated light emitter. In certain embodiments, at least one first electrically activated light emitter may be independently controllable relative to the at least one second electrically activated light emitter. In certain embodiments, one or more electrically activated light emitters may include one or more solid state light emitters, which may include one or more lumiphoric materials arranged to be stimulated by one or more solid state light emitters. In certain embodiments, multiple lumiphoric materials have different dominant wavelengths (e.g., first and second dominant wavelengths) may be provided.

In certain embodiments, emitters having different gamut properties may be arranged on a single planar support surface or multiple coplanar support surfaces, and one or more optical elements, light blocking elements, and/or light-affecting-elements may be used to cause beams or emission portions having different gamut properties to be cast in different directions when exiting a lighting device.

In certain embodiments, light reflective elements or light reflective regions having different light-affecting properties (including gamut-affecting properties) may be arranged to receive emissions of a single emitter (or multiple emitters having the same gamut properties), and cause beams or emission portions having different gamut properties to be cast in different directions when exiting a lighting device.

In certain embodiments, light-transmissive elements or light-transmissive regions having different light-affecting properties (including gamut-affecting properties) may be arranged to receive emissions of a single emitter (or multiple emitters having the same gamut properties), and cause beams or emission portions having different gamut properties to be cast in different directions when exiting a lighting device.

In certain embodiments, emitters of a lighting device having different gamut properties may be supported on individual support elements that may be adjustable (e.g., manually deformable) to permit a manufacturer or user to adjust directionality (e.g., including overlap or lack of overlap) of different beams or emission portions having different gamut properties to be cast in different directions when exiting a lighting device.

In certain embodiments, one or more light-affecting elements may be provided in combination with a single emitter or with multiple emitters having the same gamut properties, whereby a portion of light emissions are arranged to interact with a first light-affecting element, and another portion of light emissions are either (i) transmitted through a second light-affecting element differing from the first light-affecting element or (ii) not transmitted through any light-affecting element, to cause beams or emission portions having different gamut properties to be cast in different directions when exiting a lighting device.

In certain embodiments, one or more emitters having the same gamut properties may be arranged for direct transmission of light, whereby emissions of the one or more emitters is directly impinged on one or more light-affecting elements, and beams or emission portions having different gamut properties are cast in different directions when exiting a lighting device.

In certain embodiments, one or more emitters having the same gamut properties may be arranged for indirect transmission of light, whereby emissions of the one or more emitters is indirectly impinged (e.g., following reflection) on one or more light-affecting elements, and beams or emission portions having different gamut properties are cast in different directions when exiting a lighting device.

In certain embodiments, a lighting device may include one or more emitters arranged for direct transmission of light and one or more emitters arranged for indirect transmission of light (e.g., involving impingement of light on at least one reflector), whereby any of (i) at least a portion of the directly transmitted emissions and (ii) at least a portion of the indirectly transmitted emissions are impinged on one or more light-affecting elements, and beams or emission portions having different gamut properties are cast in different directions when exiting the lighting device.

In certain embodiments, a light-affecting element may comprise light-affecting material arranged in or on an electrically activated light emitter. In certain embodiments, a light-affecting element may comprise at least one light-affecting material arranged in or on a substantially light-transmissive surface or element. In certain embodiments, a light-affecting element may comprise at least one light-affecting material arranged in or on a substantially light-reflective surface or element. In certain embodiments, a light-affecting element may comprise at least one light-affecting material arranged in or on a light-diffusing surface or element.

In certain embodiments, presence, amount, and/or patterning of one or more light-affecting materials in different areas of a lighting device may be adjusted to provide desired light-affecting characteristics in order to cause beams or emission portions having different gamut properties to be cast in different directions when exiting the lighting device. In certain embodiments, multiple light-affecting materials (e.g., filters, pigments, and lumiphors) having different gamut properties may be provided in a single lighting device.

In certain embodiments, at least one transition region may be arranged between light emission regions, light output surfaces, or light output areas having different gamut properties. In certain embodiments, at least one transition region may include at least one stepped transition. In certain embodiments, at least one transition region may include at least one gradient transition. In certain embodiments, at least one transition region may include a feathered or sawtooth transition.

In certain embodiments, a lighting device may be arranged to provide at least one beam or emission portion with a higher GAI or $Q_g$ values in a central (e.g., substantially vertical) light emission direction, and to provide at least one beam or emission portion with a lower GAI or $Q_g$ values in a peripheral (e.g., substantially horizontal) light emission direction. In alternative embodiments, a lighting device may be arranged to provide at least one beam or emission portion with a higher GAI or $Q_g$ values in a peripheral (e.g., substantially horizontal) light emission direction, and to provide at least one beam or emission portion with a lower GAI or $Q_g$ values in a central (e.g., substantially vertical) light emission direction.

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising", "including", and "having", as used herein, should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if the device in the figures is turned over, structure or portion described as "above" other structures or portions would now be oriented "below" the other structures or portions.

Various types of electrically activated light emitters (e.g., solid state, incandescent, fluorescent, high intensity discharge, and the like) may be used with certain embodiments disclosed herein. Although various embodiments and examples described herein make particular reference to solid state light emitters, the scope of this disclosure is not so limited. In certain embodiments, one or more electrically activated emitters may include solid state emitters such as (but not limited to) light-emitting diodes. In certain embodiments, one or more electrically activated emitters may be arranged to stimulate emissions of one or more lumiphoric materials. In certain embodiments, lighting devices herein may include multiple lumiphor-converted electrically activated solid state light emitters. In certain embodiments, multiple different electrically activated solid state light emitters may be provided wherein one is arranged to stimulate lumiphor emissions, but may be devoid of any non-lumiphor converted blue solid state emitter (i.e., a solid state emitter having a dominant wavelength in a range of from 430 nm to 480 nm that is not arranged to stimulate emissions of a lumiphoric material).

The terms "electrically activated emitter" and "emitter" as used herein refer to any device capable of producing visible or near visible (e.g., from infrared to ultraviolet) wavelength radiation, including but not limited to, xenon lamps, mercury lamps, sodium lamps, incandescent lamps, and solid state emitters (including LEDs), organic light-emitting diodes (OLEDs), and lasers.

The terms "solid state light emitter" or "solid state emitter" represent a subset of electrically activated emitters, and may include a light emitting diode, laser diode, organic light emitting diode, and/or other semiconductor device which includes one or more semiconductor layers (e.g., silicon, silicon carbide, gallium nitride, etc.), a substrate (e.g., sapphire, silicon, silicon carbide, etc.), and one or more contact layers.

Solid state light-emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip-chip bonded (e.g., using solder) to a carrier substrate or PCB, or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Any combination of one or more of the following LED configurations may be used in a solid state lighting device disclosed herein: horizontal LED chips, horizontal flip LED chips, vertical LED chips, vertical flip LED chips, and/or combinations thereof, with conventional or reverse polarity.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength(s), or of at least one desired perceived color (including combinations of colors that may be perceived as white). Lumiphoric materials may be provided in the form of particles, films, or sheets.

In certain embodiments, lumiphoric materials may be used as light-affecting elements to cause beams or emission portions having different gamut properties to be cast in different directions when exiting a lighting device. In certain embodiments, lumiphoric materials may be present in a lighting device without being used as light-affecting elements to cause beams or emission portions having different gamut properties to be cast in different directions when exiting a lighting device Inclusion of lumiphoric (also called "luminescent") materials in lighting devices as described herein may be accomplished by any suitable means, including: direct coating on electrically activated emitters; dispersal in encapsulant materials arranged to cover electrically activated state emitters; coating on lumiphor support elements (e.g., by powder coating, inkjet printing, or the like); and incorporation into diffusers or lenses and the like. Examples of lumiphoric materials are disclosed, for example, in U.S. Pat. No. 6,600,175; U.S. Patent Application Publication No. 2009/0184616; and U.S. Patent Application Publication No. 2012/0306355, and methods for coating light-emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

In certain embodiments, at least one lumiphoric material may be spatially segregated (i.e., "remote") from and arranged to receive emissions from at least one electrically activated emitter, with such spatial separation reducing thermal coupling between an electrically activated emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness, and/or concentration may vary relative to multiple electrically activated emitters. In certain embodiments, at least one lumiphoric material may be applied to an electrically activated emitter or a lumiphoric material support surface by patterning, such may be aided by one or more masks.

Various substrates may be used as mounting elements on which, in which, or over which multiple electrically activated light emitters (e.g., solid state emitter chips) may be arranged, supported, or otherwise mounted. Exemplary substrates include printed circuit boards (including, but not limited to, metal core printed circuit boards, flexible circuit boards, dielectric laminates, and the like) having electrical traces arranged on one or multiple surfaces thereof. A substrate, mounting plate, or other support element may include a PCB, a metal core printed circuit board (MCPCB), a flexible printed circuit board, a dielectric laminate (e.g., FR-4 boards as known in the art), or any suitable substrate for mounting LED chips or packages. In certain embodiments, at least a portion of a substrate may include a dielectric material to provide desired electrical isolation between electrical traces or components of multiple emitter sets. In certain embodiments, a substrate can comprise ceramics such as alumina, aluminum nitride, silicon carbide, or a polymeric material such as polyimide, polyester, etc. In certain embodiments, a substrate may comprise a flexible circuit board or a circuit board with plastically deformable portions to allow the substrate to take a non-planar (e.g., bent) or curved shape allowing for directional light emission with electrically activated emitters (e.g., LED chips) also being arranged in a non-planar manner.

In certain embodiments, a lighting device can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of a substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light-emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light-emitting apparatus including multiple LEDs may include at least one of the following items arranged to receive light from multiple LEDs: multiple lenses; multiple optical elements; and multiple reflectors. Examples of optical elements include, but are not limited to, elements arranged to affect light mixing, focusing, collimation, dispersion, and/or beam shaping.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles. In certain embodiments, a package may include a molded lens arranged to transmit light emitted by multiple LEDs. A molded lens may be formed of liquid curable silicone in which LED chips may be embedded. Alternatively, a lens may be pre-molded and then affixed (e.g., with adhesives, thermal bonding, or any other suitable joining method) to a subassembly including a substrate to which at least one LED chip is mounted.

The expressions "lighting device", "light-emitting device", and "light-emitting apparatus" as used herein are not limited, except that such elements are capable of emitting light. That is, a lighting device or light-emitting apparatus can be a device which illuminates an area or volume (e.g., a structure, a swimming pool or spa), a room, a warehouse, an indicator, a road, a parking lot, a vehicle, signage (e.g., road signs), a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (e.g., wall mounts, post/column mounts), ceiling fixtures/wall sconces, under cabinet lighting, lamps (e.g., floor and/or table and/or desk), landscape lighting, track lighting, task lighting, specialty lighting, ceiling fan lighting, archival/art display lighting, high vibration/impact lighting (e.g., work lights etc.), mirrors/vanity lighting, or any other light-emitting devices. An illuminated area may include at least one of the foregoing items. In certain embodiments, lighting devices or light-emitting apparatuses as disclosed herein may be self-ballasted. In certain embodiments, a lighting device may be embodied in a light fixture.

In certain embodiments, a lighting device as disclosed herein (such as a solid state lighting device) may be devoid of any incandescent light-emitting element. In certain embodiments, a solid state lighting device as disclosed herein may lack any "unconverted" blue-emitting solid state emitter not arranged to stimulate emissions of a lumiphoric material.

Methods include illuminating an object, a space, or an environment utilizing one or more lighting devices or light-emitting apparatuses as disclosed herein. In certain embodiments, a lighting apparatus as disclosed herein may include multiple light-emitting elements (e.g., LEDs) arranged in at least one array (e.g., one or more two-dimensional arrays).

In certain embodiments, at least one control circuit may be arranged to adjust operation of one or more light emitters to move between at least two operating states of a lighting device in order to establish or alter directional variation in gamut properties of emissions of the lighting device. In certain embodiments, such adjustment of operation may be responsive to a user input element and/or a sensor.

In certain embodiments, at least one beam or emission portion (optionally, all beams or emission portions) exiting a lighting device as disclosed herein may be on or proximate to the blackbody locus or the white body line. In certain embodiments, at least one color point may include a desired color rendering value (e.g., CRI Ra of at least 50, at least 80, or another value disclosed herein). In certain embodiments, at least one color point may include a GAI value in a range of from 80 to 100, optionally in combination with a CRI Ra value of at least 80. In certain embodiments, first and second color points may preferably be in a desirable range of from 2,500K to 5,000K, from 2,700K to 4,000K, or some other range described herein. In certain embodiments, at least one operating state may be arranged to provide a luminous efficacy of at least 60 lumens per watt, and/or a luminous flux of at least 500 lumens.

In certain embodiments, lighting devices as disclosed herein may utilize a light-affecting element including a notch filtering material arranged to at least partially inhibit transmission of selected wavelengths of light. Such a filtering material may be used to affect (e.g., increase) $GAI/Q_g$, and/or CRI Ra. The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Different rare earth compounds may exhibit notch filtering characteristics of different wavelength ranges. For example, neodymium (or oxide thereof) when used as a filtering material may produce a spectral notch in the yellow range, whereas erbium (or oxide thereof) when used as a filtering material may produce a spectral notch in the cyan range. Additional notch filtering materials include color pigments. As with the use of rare earth compounds, the use of color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. A variety of natural and synthetic pigments are available and could be used as notch filtering materials according to certain embodiments disclosed herein. Notch filters may also be fabricated by depositing one or more dielectric layers (e.g., to form dielectric stacks) on substrates, such as filters commercially available from Thorlabs, Inc. of Newton, N.J. US, having the following center wavelengths (CWL) and full width at half maximum (FWHM) characteristics: CWL=488 nm, FWHM=15 nm; CWL=514 nm, FWHM=17 nm; CWL=533 nm, FWHM=17 nm; CWL=561 nm, FWHM=18 nm; CWL=594 nm, FWHM=23 nm; 633 nm, FWHM=25 nm; and CWL=658 nm, FWHM=26 nm.

In certain embodiments, at least one notch filtering material may be arranged to receive at least a portion of emissions generated by at least one electrically activated light emitter of a lighting device and filter the received emissions to exhibit a spectral notch (e.g., after being affected by the notch filtering material).

In certain embodiments utilizing one or more notch filtering materials, a spectral notch provided by at least one filtering material may have a full width in a range of less than or equal to 40 nm, or less than or equal to 35 nm, or less than or equal to 30 nm, or less than or equal to 25 nm, or less than or equal to 20 nm, in each case corresponding to a half maximum relative reduction in light transmission. In certain embodiments utilizing one or more notch filtering materials, at least one filtering material may be arranged to filter light within (or overlapping) the yellow-green range or yellow range, such as to provide peak attenuation in a range of from 550 nm to 590 nm, or from 570 nm to 590 nm.

In embodiments utilizing notch filtering materials, such materials may be provided as microparticles or nanoparticles of any desired size, size distribution, and geometric shape. In certain embodiments, multiple notch filtering materials may be mixed and incorporated in a carrier material or binder, or multiple notch filtering materials may otherwise be used in combination (e.g., in sequential layers, with or without a binding medium) to provide multiple spectral notches. In certain embodiments, notch filtering materials may be arranged in or on an at least partially light-transmissive optical element or enclosure, which may serve as a lens and/or diffuser. Examples of desirable materials for carriers, binding media, enclosures, and/or optical elements include, but are not limited to silicone, resin, epoxy, thermoplastic polycondensate, polymeric materials, and glass. In certain embodiments, such materials may be molded and/or cured together with at least one notch filtering material. In certain embodiments, a lighting device may include one or more transmissive optical elements and/or reflective optical elements incorporating at least one notch filtering material. For example, a so-called "troffer" style ceiling fixture may include a reflector that serves as an optical element, and may additionally include optical elements such as glass plates or lenses.

In certain embodiments utilizing notch filtering materials, at least one notch filtering material may be arranged with a substantially constant thickness and/or concentration relative to different electrically activated emitters (e.g., solid state emitters such as LEDs), one or more light-transmitting elements or regions thereof, and/or one or more light-reflecting elements or regions thereof. In certain embodiments, one or more filtering materials may be arranged on or over at least one solid state emitter (optionally with an intervening lumiphoric material), at least one light-transmitting element, or at least one light-reflecting element, with presence, composition, amount, thickness, concentration and/or patterning that vary relative to different emitters, relative to different light-transmitting elements or portions thereof, and/or relative to different light-reflecting elements or portions thereof. Multiple filtering materials (e.g., filtering materials of different compositions arranged to provide spectral notches at different wavelengths) may be applied to one or more electrically activated emitters, light-transmitting element, and/or light-reflecting elements. In certain embodiments, at least one filtering material may be applied over one or more solid state light emitters, light-transmitting elements, light-reflecting elements, or other support surface(s) utilizing a patterning technique, such may be aided by one or more masks. In certain embodiments, one or more notch filtering materials may be integrated with, or arranged in contact with, one or more portions of an emitter package, a light bulb, or a light fixture.

In certain embodiments utilizing notch filtering materials, one or more notch filtering materials may be mixed with one or more other functional materials (e.g., lumiphoric materials, scattering materials, and the like) and preferably incorporated into a binder or other carrier medium. In certain embodiments, at least one filtering material may be arranged in or on a carrier arranged to receive light from one or more electrically activated emitters.

In certain embodiments utilizing notch filtering materials, notch filtering materials may be arranged in or on a reflector, which may be either specularly reflective or diffusively reflective. Any suitable reflective material in the art may be used, including, but not limited to MCPET (microcellular foamed white polyethylene terephthalate), and surfaces metalized with one or more metals such as, but not limited to silver (e.g., a silvered surface). A preferred light-reflective material would be at least about 90% reflective, more preferably at least about 95% reflective, and still more preferably at least about 98-99% reflective of light of a desired wavelength range, such as one or more of visible light, ultraviolet light, and/or infrared light, or subsets thereof. In certain embodiments, at least one notch filtering material may be deposited on a surface of a reflector by spray coating, spin coating, sputtering, dipping, rolling, electrostatic deposition, or electrophoretic deposition. In certain embodiments, at least one notch filtering may be incorporated into a surface of a reflector via methods such as molding or sintering.

In certain embodiments utilizing notch filtering materials, one or more notch filtering materials may be coated or otherwise arranged on, over, or against at least one surface of one or more electrically activated emitters (e.g., solid state emitter chips). In certain embodiments, one or more notch filtering materials may be coated or otherwise arranged on, over, or against at least one surface of at least one lumiphoric material, wherein the at least one lumiphoric material may be arranged in direct contact with at least one surface of an electrically activated emitter (e.g., solid state emitter chip), or may be arranged remotely from (i.e., spatially segregated from) at least one surface of an electrically activated emitter. In certain embodiments, one or more notch filtering materials may be conformally coated on the surface of at least one electrically activated emitter (e.g., solid state emitter chip) and/or lumiphoric material, wherein conformal coating in this regard refers to a coating that follows the shape and contour of at least one surface (or preferably multiple surfaces) of an emitter (e.g., chip) with a substantially uniform thickness.

Parameters such as the type or composition of carrier or binding medium; the thickness, concentration, particle size, and particle size distribution of notch filtering material(s); and the presence, amount, and type of other trace substances accompanying one or more notch filtering elements, may be adjusted to provide one or more spectral notches of desired width and/or depth.

As noted previously, a color point of one or more (optionally, all) different beams, different emission portions, or different mixtures of light having different gamut properties of a lighting device may be on or proximate to (e.g., within 7 MacAdam ellipses, within 5 MacAdam ellipses, within 4 MacAdam ellipses, or within 2 MacAdam ellipses of) the blackbody locus (or the Planckian locus) in certain embodiments. In certain embodiments, a color point of one or more (optionally, all) different beams, different emission portions, or different mixtures of light having different gamut properties of a lighting device may be on or proximate to (e.g., 7 MacAdam ellipses, within 5 MacAdam ellipses, within 4 MacAdam ellipses, or within 2 MacAdam ellipses of) the white body line (a/k/a, the white body locus or line of minimum tint). The white body line may be approximated by a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808). Any of the foregoing color points may be in one or more of the following CCT ranges: from 2,500K to 10,000K, from 2,500 to 4,000K, from 2,500K to 4,000K, from 2,500K to 3,500K, from 2,500K to 3,000K, from 2,700K to 5,000K, from 2,700K to 4,100K, from 2,700K to 4,000K, from 4,100K to 10,000K, from 4,100K to 8,000K, and from 4,100K to 6,500K.

In certain embodiments, one or more (optionally, all) different beams, different emission portions, or different mixtures of light having different gamut properties may have a luminous efficacy in at least one of the following lumens per watt ranges: at least 60, at least 80, at least 100, at least 120, or at least 140. In certain embodiments, one or more (optionally, all) different beams, different emission portions, or different mixtures of light having different gamut properties have a GAI (or $Q_g$) value of at least 50 and a CRI Ra value of at least 50, with the foregoing ranges optionally being bounded by 70, 80, 90, or 100 at the upper end. In certain embodiments, one or more (optionally, all) different beams, different emission portions, or different mixtures of light having different gamut properties have a GAI (or $Q_g$) value in a range of from 80 to 100 in conjunction with a CRI Ra value of at least 80, optionally bounded at the upper end by a CRI RA value of 90, 92, 94, or 96.

In certain embodiments, a lighting device may include one or more light-affecting materials arranged to alter gamut properties of light emitted by one or more electrically activated emitters and/or lumiphoric materials of a lighting device. Examples of light-affecting materials that may affect gamut properties include, but are not limited to, filters (such as notch filters), pigments, lumiphors, and the like. In certain embodiments, light-affecting materials may be arranged in, arranged on, or otherwise applied to electrically activated emitters, substantially light-transmissive elements, and/or substantially light reflective elements. In certain embodiments, presence, concentration, amount, and/or patterning of one or more light-affecting materials may be used to adjust light-affecting (e.g., gamut-altering) characteristics.

In certain embodiments, at least one of the first light-emitting region and the second light-emitting region may include at least one light-affecting material arranged to alter (e.g., increase) gamut characteristics (e.g., GAI and/or $Q_g$ values), and at least one of presence, composition, amount, concentration, thickness, and patterning of at least one light-affecting material may differ among a first light-emitting surface or region and a second light-emitting surface or region. In certain embodiments, a first light-emitting region or surface may include light-affecting material, and a second light-emitting region or surface may be devoid of light-affecting material. In certain embodiments, at least one light-affecting material may be arranged in or on at least a portion of a substantially light-transmissive element. In certain embodiments, at least one light-affecting material may be arranged in or on at least a portion of a substantially light reflective element. In certain embodiments, a light-transmissive element may include an interior surface and an exterior surface that are both arranged in fluid communication with (e.g., to receive air from) an ambient environment. In certain embodiments, at least one light-affecting material may include one or more notch filtering materials, one or more lumiphoric materials, and/or one or more color pigments. In certain embodiments, a first light-emitting region includes a first lumiphoric material, and a second light-emitting region comprises a second lumiphoric material that comprises a different dominant wavelength than the first lumiphoric material (e.g., differing in dominant wavelength by a value of at least 20 nm, at least 30 nm, at least 50 nm, or another desired threshold).

In certain embodiments, a lighting device may include multiple electrically activated light emitters having different gamut properties (e.g., GAI values differing by at least 10%, by at least 15%, or another threshold disclosed herein, or $Q_g$ values differing by at least 5%, by at least 10%, by at least 15%, or another threshold disclosed herein), wherein emitters or groups of emitters with different gamut properties are arranged to illuminate different regions of a light output surface or area of the lighting device. In certain embodiments, at least one first electrically activated light emitter is independently controllable relative to at least one second electrically activated light emitter. In certain embodiments, a lighting device may include a user input element or sensor wherein any of (i) at least one first electrically activated light emitter and (ii) at least one second electrically activated light emitter is operated responsive to an output signal of the user input element or sensor.

In certain embodiments, a first emitter or emitter group (e.g., arranged to produce a first mixture of light including a first color point) and a second emitter or emitter group (e.g., arranged to produce a second mixture of light including a second color point) may be separately arranged to produce white light with different gamut areas and/or relative gamut values, and the different mixtures of light may be transmitted or reflected in different directions. In certain embodiments, a difference in direction between first and second mixtures of light may meet one or more of the following thresholds: at least about 15 degrees, at least about 25 degrees, at least about 35 degrees, at least about 45 degrees, at least about 55 degrees, at least about 65 degrees, at least about 75 degrees, and at least about 90 degrees.

In certain embodiments, a first electrically activated emitter or electrically activated emitter group may include at least one first solid state emitter, and a second electrically activated emitter or emitter group may include at least one second solid state emitter. Either emitter/emitter group or both emitters/emitter groups may include one or more solid state emitters arranged to stimulate emissions of at least one lumiphoric material.

In certain embodiments, a lighting device may include multiple light-emitting regions to transmit or reflect emission portions having different gamut properties (e.g., GAI values differing by at least 10%, by at least 15%, or another threshold disclosed herein, or $Q_g$ values differing by at least 5%, by at least 10%, by at least 15%, or another threshold disclosed herein). In certain embodiments, different light-emitting regions may be arranged to transmit emission portions or light beams having different GAI or $Q_g$ values in different directions (e.g., a predominantly vertical direction and a predominantly horizontal direction, or another combination of directions), such as may include a first beam or group of beams centered in a first direction, and a second beam or group of beams centered in a second direction. In certain embodiments, a difference in direction between first and second beams or groups of beams may meet one or more of the following thresholds: at least about 15 degrees, at least about 25 degrees, at least about 35 degrees, at least about 45 degrees, at least about 55 degrees, at least about 65 degrees, at least about 75 degrees, and at least about 90 degrees.

In certain embodiments, a first light-emitting region or area of a lighting device may include a first gamut property (e.g., a first GAI and/or $Q_g$ value), a second light-emitting region or area of a lighting device may include a second gamut property (e.g., a second GAI and/or $Q_g$ value) that differs from the first gamut property, and at least one intermediate region arranged between the first light-emitting region or area, wherein the at least one intermediate region is arranged to provide emissions having a third gamut property (e.g., a third GAI and/or $Q_g$ value) that is between the first gamut property and the second gamut property.

In certain embodiments, at least one transition region may be arranged between a first light-emitting region or area (having a first GAI and/or $Q_g$ value) and a second light-emitting region or area (having a second GAI and/or $Q_g$ value) of a lighting device, wherein the at least one transition region is arranged to provide a gradient (e.g., gradual) transition of gamut properties (e.g., including at least one GAI and/or $Q_g$ value between the first and the second GAI and/or $Q_g$ values). In certain embodiments, a transition region may include a stepwise transition of gamut properties including one or more sharp steps in GAI and/or $Q_g$ value. In certain embodiments, a transition region may include a sawtooth or feathered boundary of gamut properties between first and second regions. Provision of a transition region between a first and a second light-emitting region or area may reduce perceptibility of a boundary between first and second light-emitting regions or areas of a lighting device, and/or may reduce perceptibility of illumination differences between different surfaces or areas illuminated by first and second light-emitting regions or areas of a lighting device.

In certain embodiments, one or more light-affecting materials as disclosed herein may be arranged in or on a lens, diffuser, or globe that serves as an outermost light-transmissive surface of a lighting device. In certain embodiments, one or more light-affecting materials as disclosed herein may be arranged within an interior portion or cavity of a lighting device that is bounded by a lens, diffuser, or globe, wherein the one or more light-affecting materials are not arranged in contact with the lens, diffuser, or globe. In certain embodiments, one or more light-affecting materials as disclosed herein may be arranged outside an interior portion or cavity of a lighting device that is bounded by a lens, diffuser, or globe, wherein the one or more light-affecting materials are not arranged in contact with the lens, diffuser, or globe.

In certain embodiments, a lighting device may include at least one first electrically activated light emitter arranged to produce, in the absence of any additional light, emissions having a first GAI value; and at least one second electrically activated light emitter arranged to produce, in the absence of any additional light, emissions having a second GAI value, wherein the second GAI value differs from the first GAI value by at least 10%; wherein the at least one first electrically activated emitter is arranged to illuminate a first region of a light output surface or area of the lighting device; and wherein the at least one second electrically activated emitter is arranged to illuminate a second region of a light output surface or area of the lighting device. In certain aspects, the preceding GAI threshold may be replaced with one or more $Q_g$ values or other GAI values as disclosed herein. In certain embodiments, the first region may be arranged to transmit or reflect at least a portion of emissions of the at least one first electrically activated light emitter in a vertical direction, and the second region may be arranged to transmit or reflect at least a portion of emissions of the at least one second electrically activated light emitter in a lateral direction. In certain embodiments, a notch filtering material may be arranged to receive at least a portion of emissions generated by the at least one first electrically activated light emitter and filter the received emissions to exhibit a spectral notch (e.g., after being affected by the notch filtering material). In certain embodiments, one or more of the at least one first electrically activated light emitter and the at least one second electrically activated light emitter may comprise at least one electrically activated solid state light emitter and/or at least one lumiphoric material may be arranged to be stimulated by at least one electrically activated (e.g., solid state) light emitter. In certain embodiments, the at least one first electrically activated light emitter may be independently controllable relative to the at least one second electrically activated light emitter. In certain embodiments, at least one of the first region and the second region may include at least one light-affecting material as disclosed herein arranged to increase GAI, and at least one of presence, composition, concentration, amount, thickness, and patterning of at least one light-affecting material may differ among the first region and the second region. In certain embodiments, the at least one light-affecting material may include a filtering material, a lumiphoric material, a color pigment material, or other material arranged to alter gamut properties of light upon interaction with the light-affecting material. In certain embodiments, at least one intermediate or transition region as disclosed herein may be provided between first and second regions.

In certain embodiments, a retrofit element for a lighting device may include an attachment structure arranged for removable attachment to the lighting device, and a light-affecting material supported by the attachment structure and arranged to span across a portion of a light output surface or area of the lighting device, wherein the light-affecting material is arranged to receive emissions from the lighting device having a first GAI value, interact with the received emissions to produce gamut-altered emissions having a second GAI value by at least 10%, and transmit the gamut-altered emissions to exit the retrofit element. In certain aspects, the preceding GAI threshold may be replaced with one or more $Q_g$ values or other GAI values as disclosed herein. In certain embodiments, the light-affecting material may be arranged on a light-transmissive substrate. In certain embodiments, the light-affecting material may be arranged in a non-contacting relationship relative to an outermost light-transmissive surface of a lighting device. In certain embodiments, the light-affecting material may be arranged to be pressed against or adhered (e.g., removably adhered) to an outermost light-transmissive surface of a lighting device, wherein the attachment structure may include an adhesive. In certain embodiments, an attachment structure may be arranged for removable attachment to a base or body structure of a light bulb, or for removable attachment to a luminaire. In certain embodiments, a light-affecting material may be arranged in a substantially planar conformation. In certain embodiments, a light-affecting material may be arranged in a curved, faceted, or other non-planar conformation. In certain embodiments, light-affecting material may be arranged in or on a light-transmissive substrate, and at least one of concentration, thickness, and patterning of the light-affecting material may vary with position along or relative to the light-transmissive substrate.

Various features and embodiments of the present disclosure are described with reference to the accompanying figures.

FIG. 6A is a schematic elevation view of an interior space 40 including an overhead (e.g., ceiling-mounted) electrically activated lighting device 50 arranged to illuminate an indoor environment with light beams propagating in different directions, and with dashed lines 34 demarking regions having different gamut properties (e.g., GAI and/or $Q_g$ values). FIG. 6B is a schematic elevation view of the lighting device 50 and the dashed lines 34 depicted in FIG. 6A. The interior space 40 includes a ceiling 41, floor 42, walls 43, 44, wall-mounted features 45, 46, and a table or elevated surface 49. At least one electrically activated emitter 55 arranged to illuminate first and second light-transmissive surfaces or regions 51, 52 of the electrically activated lighting device 50. The first light-transmissive surface or region 51 is centrally arranged along the electrically activated lighting device 50 and transmits a group of light beams that are centered in a vertical direction to illuminate the table or elevated surface 49 as well as the floor 42 and lower portions of the walls 43, 44. The second light-transmissive surface or region 52 is peripherally arranged along the lighting device and transmits a group of light beams that are centered in a non-vertical direction (e.g., predominantly lateral direction) toward the wall-mounted features 45, 46 (preferably including at least one beam in a substantially horizontal direction along a horizontal axis (h)). Dashed lines 34, which deviate from a vertical axis (v) by an angle θ, demarcate a transition between (i) a first illuminated region 31 (R1 in FIG. 6B) that is illuminated with light transmitted through the first light-transmissive surface or region and having a first gamut property and (ii) a second illuminated region 32 (R2 in FIG. 6B) that is illuminated with light transmitted through the second light-transmissive surface or region and having a second gamut property that differs from the first gamut property. In certain embodiments, the different gamut properties may include GAI values differing by at least 10%, by at least 15%, or another threshold disclosed herein, and/or $Q_g$ values differing by at least 5%, by at least 10%, by at least 15%, or another threshold disclosed herein. In this manner, a single electrically activated lighting device 50 may be used to illuminate the first and second illuminated regions 31, 32 with light having different gamut properties, such as may be desirable to illuminate the table or elevated surface 49 with light having a relatively high gamut and to illuminate the wall-mounted features 45, 46 with light having a relatively low gamut, or vice-versa.

In certain embodiments, emitters having different gamut properties may be arranged on different (e.g., non-coplanar) support surfaces, and aimed or oriented in different directions to cause beams or emission portions having different gamut properties to be cast in different directions when exiting a lighting device. In certain embodiments, one or more light blocking and/or light-affecting materials may be provided between emitters having different gamut properties.

FIG. 7 is a side cross-sectional view of at least a portion of a lighting device 100 including first, second, and third electrically activated light sources 121, 122A, 122B (e.g., preferably having different gamut properties) oriented on differently-angled surfaces 111, 112, 113 of a support structure 114 to emit beams or groups of beams centered in different directions. Preferably, the second and the third light sources 122A, 122B supported by the differently angled surfaces 112, 113 have gamut properties (e.g., GAI and/or $Q_g$ values) that differ from gamut properties of the first light source 121 supported by the differently angled surface 111. Light blocking elements 116A, 116B extending from the support structure 114 are arranged between the adjacent electrically activated light sources 121, 122A, 122B, and may optionally include reflective walls. The light blocking elements 116A, 116B may function to limit overlap and/or mixing of emissions emanating in a lateral direction from portions (e.g., lateral wall surfaces) of the adjacent electrically activated light sources 121, 122A, 122B. A light-transmissive cover 130, which may serve as a diffuser, includes tab portions 139 that may be retained by recesses 115 defined in the support structure 114. Light transition regions 135A, 135B may be provided in or on the cover 130 at positions between the electrically activated light sources 121, 122A, 122B. The light transition regions 135A, 135B may include light scattering material and/or light blocking material, wherein concentration, amount, and/or patterning of light scattering or light blocking material may vary with lateral position along the light-transmissive cover 130. The light transition regions 135A, 135B may function to reduce appearance of a sharp boundary in gamut properties between a first illuminated region R1 illuminated by the first electrically activated light source 121 and a second illuminated region R2 illuminated by the second electrically activated light source 122A and/or the third electrically activated light source 122B. In certain embodiments, the light blocking regions 116A, 116B and/or the light transition regions 135A, 135B may be omitted.

In certain embodiments, emitters having different gamut properties may be arranged on a single planar support surface or multiple coplanar support surfaces, and one or more optical elements, transition/light blocking elements, and/or light-affecting materials may be used to cause beams or emission portions having different gamut properties to be cast in different directions when exiting a lighting device.

FIG. 8 is a side cross-sectional view of at least a portion of a lighting device 200 including groups of electrically activated light sources 221, 222 (e.g., preferably having different gamut properties between groups thereof) oriented on different portions of a substantially planar substrate 212, with transition or light blocking elements 216 and/or light-affecting materials 217 arranged between adjacent groups of light sources 221, 222, and with at least one optical element 240 arranged to direct at least substantial portions of emissions of different groups of light sources 221, 222 in different directions. The optical element 240 includes light entry regions (e.g., recesses) 248 arranged to receive emissions of the electrically activated light sources 221, 222. Edge portions 246 of the optical element 240 may comprise reflective material to prevent escape of light emissions. Lateral walls 242 of the optical element 240 may be angled away from vertical in a peripheral direction. A central portion 241 of the optical element may include a concave wall 243 terminating at a boundary surface 245 that demarcates a boundary between the lateral walls 242 and the concave wall 243. Optionally arranged in or along the optical element 240 are transition elements (which may be partially light-transmissive and optionally may include light scattering material) or light blocking elements (which may be reflective) 216. The transition elements or light blocking elements 216 may serve to limit lateral interaction or mixing or emissions of different groups of electrically activated light sources 221, 222. Additionally or alternatively arranged in or along the optical element 240 are optional light affecting materials 217 (e.g., notch filtering materials, lumiphoric materials, and/or color pigments), which may serve to increase gamut of emissions transmitted in a central direction from the concave wall 243. In certain embodiments, the lateral walls 242 or lateral portions of the optical element 240, and/or the concave wall 243 or the central portion 241 of the optical element 240 may include one or more light-affecting materials. In operation of the lighting device 200, a first set of light beams or first emission portion having a first gamut property (e.g., first GAI or $Q_g$ value) is cast in a central (e.g., predominantly vertical) direction to provide a first illuminated region R1, and a second set of light beams or second emission portion having a second gamut property (e.g., second GAI or $Q_g$ value) differing from the first gamut property is cast in a peripheral (e.g., predominantly non-vertical) direction to provide a second illuminated region R2. In this manner, beams or emission portions having different gamut properties may be cast in different directions when exiting the lighting device 200.

In certain embodiments, emitters of a lighting device having different gamut properties may be supported on individual support elements that may be adjustable (e.g., manually deformable) to permit a manufacturer or user to adjust directionality (e.g., including overlap or lack of overlap) of different beams or emission portions having different gamut properties to be cast in different directions when exiting a lighting device.

FIG. 9 is a side cross-sectional view of at least a portion of a lighting device 300 (configured as a light fixture 301 mountable to a pole 302 using a pole mount 303) including multiple electrically activated light sources 321, 322, 323 (e.g., preferably having different gamut properties) arranged to emit light in different directions. Each light source 321, 322, 323 is supported by a different support element 311, 312, 313 extending from a substrate 310 that is optionally secured to a backing plate 305 via slide brackets 307 to permit adjustment. Each support element may be configured to be adjustable (e.g., manually deformable, or adjustable using one or more tools) to permit a manufacturer or user to adjust directionality of different beams or emission portions having different gamut properties to be cast in different directions when exiting a lighting device. A suitable light-transmissive enclosure 330 to enclose and protect the light fixture 301 from environmental exposure may be attached to the backing plate 305 via fasteners 338 (e.g., screws or clasps). The light-transmissive enclosure 330 may include multiple transmissive regions 331, 332, 333 arranged to receive emissions from different electrically activated light sources 321, 322, 323, with the adjacent transmissive regions 331, 332, 333 optionally being separated by boundaries or transitions 335, 336. In certain embodiments, different electrically activated light sources 321, 322, 323 may be arranged to generate emissions with different gamut properties. With electrically activated light sources 321, 322, 323 having different gamut properties arranged to illuminate different areas of the light-transmissive enclosure 330, beams or emission portions having different gamut properties may be cast in different directions when exiting the lighting device 300. In certain embodiments, different transmissive regions 331, 332, 333 may include one or more light-affecting materials (e.g., differing in composition, amount, thickness, concentration, and/or patterning) arranged to alter gamut properties of light received from the respective electrically activated light sources 321, 322, 323. With different transmissive regions 331, 332, 333 having different gamut-affecting properties and being oriented in different directions, beams or emission portions having different gamut properties may be cast in different directions when exiting the lighting device 300. In certain embodiments, electrically activated light sources 321, 322, 323 having different gamut properties may be arranged in combination with different transmissive regions 331, 332, 333 including one or more light-affecting materials (e.g., differing in composition, concentration, amount, thickness, and/or patterning). In one embodiment, at least one light-affecting material arranged to increase a gamut property to a first value is provided in a first transmissive region 331, at least one light-affecting material arranged to increase a gamut property to a second value is provided in a second transmissive region 332, and a third transmissive region 333 may be either devoid of light-affecting material or may include light-affecting material to increase a gamut property to a third value, wherein a gamut property declines in value from the first transmissive region 331 to the second transmissive region 332, and further declines in value from the second transmissive region 332 to the third transmissive region 333. In certain embodiments, separations or boundaries 335, 336 may include a transition (e.g., stepped, gradient, sawtooth, feathered, or other transition) between adjacent transmissive regions 331, 332, 333 in order to reduce perception of illumination differences between different surfaces or areas illuminated by different regions of the a lighting device 300.

In certain embodiments, one or more light-affecting elements may be provided in combination with a single emitter or with multiple emitters having the same gamut properties, whereby a portion of light emissions are arranged to interact with a first light-affecting element, and another portion of light emissions are either (i) transmitted through a second light-affecting element differing from the first light-affecting element or (ii) not transmitted through any light-affecting element, to cause beams or emission portions having different gamut properties to be cast in different directions when exiting a lighting device. In various embodiments, lighting devices may be arranged for direct or for indirect illumination of one or more light-affecting elements.

FIG. 10 is a side cross-sectional view of at least a portion of a direct emission lighting device 400 including at least one electrically activated emitter 421, a primary reflector 410, a secondary reflector 440, a heatsink 401, and light-transmissive regions 451, 452 having different filtering and/or wavelength conversion properties. The lighting device 400 may embody a troffer fixture arranged for mounting in a ceiling. Although only a single electrically activated emitter 421 is shown, it is to be appreciated that in certain embodiments the lighting device 400 may include multiple electrically activated emitters 421 that may be linearly arranged (e.g., in a direction extending into or out from the illustration). In certain embodiments, a first light-transmissive region 451 includes a light-affecting material arranged to increase a gamut property of emissions transmitted therethrough, and second light-transmissive regions 452 may either be devoid of light-affecting material to adjust a gamut property or may include light-affecting material of a composition, amount, thickness, concentration, or pattern differing from light-affecting material contained in the first light-transmissive region. In this manner, emissions transmitted through the first light-transmissive region 451 (corresponding to a light output region R1) may have a gamut property (e.g., GAI or $Q_g$) value that differs from a gamut property value of emissions transmitted through a second light-transmissive region 452 (corresponding to a light output region R2), permitting different beams or emission portions having different gamut properties to be cast in different directions when exiting the direct emission lighting device 400. In certain embodiments, the electrically activated emitter 421 may include multiple electrically activated emitters having different gamut properties that are separately directed to illuminate different light-transmissive regions. For example, one or more centrally arranged electrically activated emitters having different gamut properties may be arranged to transmit light through a first interior portion 431 of the direct emission lighting device 400 to impinge on the first light-transmissive region 451, and one or more peripherally arranged electrically activated emitters may be arranged to transmit light through at least one second interior portion 432 of the device 400 to impinge on the second light-transmissive region 452, wherein the first and second interior portions 431, 432 may be separated by an imaginary or a real boundary 434 (e.g., including scattering, at least partially reflecting, or at least partially light blocking material).

In certain embodiments, light-affecting material may be arranged in or on light-transmissive and/or light-reflective regions to permit light beams with different gamut properties to be output in different directions, and a lighting device may be arranged for indirect lighting.

FIGS. 11A-11C illustrate at least portions of a reflected or indirect emission lighting device 500 including one or more light-affecting regions (e.g., providing filtering and/or wavelength conversion utility) to yield light output regions R1, R2 arranged to output light with different gamut properties in different directions. The lighting device 500 may embody a light fixture suitable for mounting in or for suspension from a ceiling. The lighting device 500 includes a light engine 501 including light strips 506 containing multiple electrically activated emitters 505 arranged along the perimeter of a cup 502 and angled generally upward toward the reflector dome 511. A control circuit 508 may be integrated onto the light strips 506 or may be disposed externally to the cup 502 or remote from the fixture. The cup 502 may be supported by laterally-extending arms 520 that suspend the cup 502 below the reflector dome 511 and inboard of an angled pan 512. An upper cavity 519A is bounded by the reflector dome 511 and is generally arranged above the cup 502, and a lower cavity 519B is bounded laterally by the angled pan 512 and is generally arranged below the cup 502. Voids 519C between adjacent arms 520 connect the upper cavity 519A and the lower cavity 519B to permit passage of at least a portion of light reflected by the reflector dome 511. The cup 502 includes a central panel 503 and peripheral panels 504. The reflector dome 511 includes a central region 517 and a peripheral region 514. In certain embodiments, at least one light-affecting material may be associated with one or more panels 503, 504 of the cup 502 and/or associated one or more reflective regions 514, 517 of the reflector dome 511 in order to produce light with different gamut properties in different directions. In certain embodiments, a central output region R1 may include emissions with an elevated gamut property relative to an emissions of a peripheral output region R2. In other embodiments, the opposite result may be obtained.

In certain embodiments, one or more of the panels 503, 504 of the cup 502 may be substantially transmissive, wherein emissions of the electrically activated emitters 505 may impinge on the panels 503, 504 (whether directly and/or indirectly following reflection from the reflective regions 514, 517 of the reflector dome 511) and optionally interact with one or more light-affecting materials arranged in or on the panels 503, 504. In certain embodiments, light-affecting material may be arranged in differing presence, composition, amount, thickness, concentration, or patterning between the central panel 503 and the peripheral panels 504, such as to permit a gamut property of emissions transmitted through the central panel 503 to differ from a gamut property of emissions transmitted through one or more of the peripheral panels 504. In certain embodiments, the central panel 503 may be arranged to increase a gamut property more than the peripheral panels 504; in other embodiments, the opposite result may be obtained.

In certain embodiments, one or more of the panels 503, 504 of the cup 502 may be substantially transmissive (optionally in combination with one or more light-affecting materials), and at least one light-affecting material may be associated with at least one reflective region 514, 517 of the reflector dome 511, whereby a portion of emissions of the electrically activated emitters 505 may impinge on the one reflective region 514, 517 to affect a gamut property of the emissions, and another portion of emissions of the electrically activated emitters 505 may impinge on the other reflective region 514, 517 that may be devoid of light-affecting material (or contain a light-affecting material that differs in presence, composition, amount, thickness, concentration, or patterning). The resulting emissions may be transmitted through the cup 502 and/or through the voids 519C to exit the lighting device 500. In certain embodiments, the central reflective region 517 may be arranged to increase a gamut property more than the peripheral reflective region 514; in other embodiments, the opposite result may be obtained. In this manner, different regions 514, 517 may be arranged to reflect beams having different gamut properties in different directions.

In certain embodiments, one or more of the panels 503, 504 of the cup 502 may be substantially reflective, and at least one light-affecting material may be associated with at least one reflective region 514, 517 of the reflector dome 511, whereby a portion of emissions of the electrically activated emitters 505 may impinge on the one reflective region 514, 517 to affect a gamut property of the emissions, and another portion of emissions of the electrically activated emitters 505 may impinge on the other reflective region 514, 517 that may be devoid of light-affecting material (or contain a light-affecting material that differs in presence, composition, amount, thickness, concentration, or patterning). The resulting emissions may be transmitted through the voids 519C (i.e., past the cup 502) to exit the lighting device 500. In certain embodiments, the central reflective region 517 may be arranged to increase a gamut property more than the peripheral reflective region 514; in other embodiments, the opposite result may be obtained. In this manner, different regions 514, 517 may be arranged to reflect beams having different gamut properties in different directions.

In certain embodiments, light-affecting material may be arranged in or on a light-transmissive material to permit light beams with different gamut properties to be output in different directions, and a lighting device may be arranged for direct lighting.

FIG. 12A illustrates a direct emission lighting device 600A including a baffle assembly 620, and FIG. 12B illustrates a portion of the lighting device 600A without the baffle assembly 620.

The lighting device 600A includes an upper housing 616 mounted to a heatsink 612 arranged proximate to a junction box 624. A reflective material 656 (such as metal, polymeric material, microcellular polyethyleneterephthalate, or the like) may be arranged along interior surfaces of the upper housing 616. The upper housing 616 includes an opening adjacent the heatsink 612 in which is arranged a printed circuit board (PCB) 660 having LEDs 662 mounted thereon. The PCB 660 may be thermally and mechanically coupled to the heatsink 612. A basket assembly 618 includes a frame 650 which itself includes an internal frame member 670 and an external frame member 672 that reflectively define two openings. The internal frame member 670 defines a central opening in which a first lens 652 is provided, with the internal frame member 670 and the first lens 652 together defining a first light transmitting window of the basket assembly 618. One or more films or other diffusing structures 658 may be provided on or as part of the first lens 652. A second lens 654 is provided in a space between the external frame member 672 and the internal frame member 670. The space between the internal frame member 670 and the external frame member 672 and the second lens 654 define a second light transmitting window of the basket assembly 618. In certain embodiments, provision of one or more second light transmitting windows about the periphery of a first light transmitting window provide a softened transition from a bright central portion of the basket assembly 618 to a less bright peripheral portion of the fixture (e.g., with lower luminous intensity outer windows).

In certain embodiments, at least one light-affecting material may be associated with one or more of the first lens 652 and the second lens 654, with the at least one light-affecting material differing in presence, composition, amount, thickness, concentration, or patterning between the respective lenses 652, 654. In this manner, gamut properties of emissions transmitted through the lenses 652, 654 may be different, thereby permitting beams having different gamut properties to escape the device 600A in different directions. In certain embodiments, a central output region R1 may include emissions with an elevated gamut property relative to an emissions of a peripheral output region R2. In other embodiments, the opposite result may be obtained.

In certain embodiments (as shown in FIG. 12A), the lighting device 600A may include a centrally arranged light-affecting element 690A (e.g., disposed outside a cavity defined by the baffle assembly 620), optionally suspended by supports 691A. The light-affecting element 690A includes at least one light-affecting material and is arranged to receive and increase a gamut property of a central portion of emissions of the lighting device 600A, such that a central output region R1 may include emissions with an elevated gamut property relative to an emissions of a peripheral output region R2.

In certain embodiments, a light-affecting element may be arranged within a cavity defined by a baffle (or other reflector) of a lighting device.

FIG. 12C illustrates another direct emission lighting device 600C similar to the device 600A of FIG. 12A, but including a centrally arranged light-affecting element 690C disposed outside within a cavity defined by the baffle assembly 620, optionally suspended by supports 691C. The light-affecting element 690C includes at least one light-affecting material and is arranged to receive and increase a gamut property of a central portion of emissions of the lighting device 600C, such that a central output region (e.g., region R1 in FIG. 12A) may include emissions with an elevated gamut property relative to an emissions of a peripheral output region (e.g., region R2 in FIG. 12A).

In certain embodiments, a light-affecting element may be arranged along a peripheral portion of a lighting device in order to increase gamut of peripherally-directed (as opposed to centrally-directed) emissions of the lighting device.

FIG. 12D is a side elevation view of a direct emission lighting device 600D similar to the device 600A of FIG. 12A, but centrally arranged light-affecting element 690D disposed outside within a cavity defined by the baffle assembly 620, optionally suspended by supports 691D. The light-affecting element 690D includes at least one light-affecting material and is arranged to receive and increase a gamut property of a peripheral portion of emissions of the lighting device 600D, such that a peripheral output region (e.g., region R2 in FIG. 12A) may include emissions with an elevated gamut property relative to an emissions of a central output region (e.g., region R1 in FIG. 12A).

In certain embodiments, at least one light-affecting material may be associated with a reflector and/or an externally arranged light-transmissive element of an indirect (e.g., reflected) illumination lighting device. In certain embodiments, at least one light-affecting material or light-affecting element may optionally be arranged for removable attachment to a lighting device (e.g., a light fixture), such as by attachment to a heatsink thereof.

FIG. 13A illustrates a lighting device embodied in a troffer-type (in-ceiling linear) light fixture 700 arranged to incorporate multiple electrically activated emitters 726 (e.g., LEDs) as disclosed herein arranged on a substrate 724 in thermal communication with a heatsink 702. FIG. 13B is a side cross-sectional view of a portion of a reflected emission lighting device according to FIG. 13A. The light fixture 700 includes a pan 701, reflector 708, and end caps 710, 711. The end cap 710 is larger than the end cap 711 and is shaped to act as a circuit box to house electronics used to drive and control the light source (e.g., rectifiers, regulators, timing circuitry, etc.). Although a reflector may take various shapes, in the illustrated embodiment, the reflector 708 includes a flat region opposite the heatsink 702, with the reflector including a central region 719 and a peripheral region 718. In alternative embodiments, the reflector 708 could be parabolic in shape, or include two or more parabolic regions. The light fixture 700 also includes a diffuser lens assembly including lens plates 715, 716, disposed adjacent to sides of the heatsink 702 and extending to the periphery of the reflector 708 as shown in FIG. 13B.

In certain embodiments, at least one light-affecting material may be associated with the one or more regions 718, 719 of the reflector 708 and/or associated with light-transmissive elements 791, 792 arranged proximate to the lens plates 715, 716 (e.g., extending across only a central portion of the lens plates 715, 716 proximate to the heatsink 702), in order to transmit beams having different gamut properties in different directions. In certain embodiments, the light-transmissive elements 791, 792 may be coated on, impregnated in, or otherwise affixed to the lens plates 715, 716. In certain embodiments, the light-transmissive elements 791, 792 may be arranged for removable attachment to the lens plates 715, 716, the heatsink 702, and/or one or more trim structures (not shown).

In certain embodiments, at least one light-affecting material may be associated with the at least one region 718, 719 of the reflector 708, and another of the regions 718, 719 of the reflector may be devoid of light-affecting material (or contain a light-affecting material that differs in presence, composition, amount, thickness, concentration, or patterning), so that the regions 718, 719 differently affect gamut of light received from the electrically activated emitters 726 and reflected toward the lens plates 715, 716. In certain embodiments, presence, composition, amount, thickness, concentration, or patterning of light-affecting material may vary in a stepwise or substantially continuous (e.g., gradient) manner with respect to position along the reflector 708 to provide a desired transition in gamut affecting properties.

In certain embodiments, at least one light-affecting material may be associated with the light-transmissive elements 791, 792 extending across only a central portion of the lens plates 715, 716 proximate to the heatsink 702, and the remainder (e.g., peripheral portions) of the lens plates 715, 716 may be devoid of any associated light-affecting material. In alternative embodiments, light-transmissive elements may extend across only a peripheral portion of the lens plates 715, 716 proximate to the reflector 708, and the remainder (e.g., central portions) of the lens plates 715, 716 may be devoid of any associated light-affecting material. In certain embodiments, presence, composition, amount, thickness, concentration, or patterning of light-affecting material may vary in a stepwise or substantially continuous (e.g., gradient) manner with respect to position in or along the light-transmissive elements 791, 792 to provide a desired transition in gamut affecting properties.

In operation of the lighting device 700, emissions from the electrically activated emitters 726 impinge on the central region 719 and peripheral region 718 of the reflector 708 for reflection toward the lens plates 715, 716. Gamut properties of different portions of the reflected emissions may be affected differently by the central region 719 and the peripheral region 718 depending on differing presence of one or more light-affecting materials as disclosed herein. Alternatively, or additionally, gamut properties of different portions of reflected emissions may be affected by light-affecting material associated with the light-transmissive elements 791, 792 upon transmission of reflected emissions through the lens plates 715, 716. In this manner, beams having different gamut properties may be transmitted in different directions from the lighting device 700. In certain embodiments, a central output region R1 (e.g., below the light-transmissive elements 791, 792) may include emissions with an elevated gamut property relative to an emissions of a peripheral output region R2. In other embodiments, the opposite result may be obtained.

In certain embodiments, one or more lumiphoric materials, notch filtering materials, or other light-affecting materials may be associated with one or more electrically activated emitters 726. In certain embodiments, the lighting device 700 may include multiple electrically activated emitters 726 arranged to emit beams with different gamut properties in different directions.

FIG. 13C illustrates a portion of a reflected emission lighting device 700A similar to the device illustrated in FIG. 13B, with the lighting device 700A, but with light-transmissive elements 791A, 792A (preferably including at least one light-affecting material arranged to increase a gamut property light transmitted therethrough) that are spatially separated from the lens plates 715, 716. Such transmissive elements 791A, 792A may optionally be arranged for removable attachment (e.g., using clips or fasteners 793, 794) to the lens plates 715, 716, the heatsink 702, and/or one or more trim structures (not shown). Removable attachment of the transmissive elements 791A, 792A including light-affecting materials may permit a user or manufacturer to provide or adjust gamut affecting properties of a light fixture without requiring provision or installation of a new fixture.

In certain embodiments, a solid state emitter package may include one or more solid state emitter chips and be arranged to emit light beams with different gamut properties in different directions. Such emitter chips may optionally include angled or beveled upper edges with a non-rectangular (e.g., polygonal) cross-section, with such shape serving to enhance light extraction. In certain embodiments, one or more light-affecting materials may be associated with one or more solid state emitters and/or a lens or optical element associated with the package.

FIG. 14 is a side cross-sectional view of at least a portion of a solid state light-emitting device 890 including multiple solid state emitter (e.g., LED) chips 895 arranged over a submount 891 in flip-chip configuration, with both anode and cathode connections on the bottom of the solid state emitter chips 895. The submount 891 (e.g., alumina, aluminum nitride, high temperature polymers, etc.) may be covered with a pattern of metal (e.g., traces) 893 that may be used to interconnect the emitter chips 895 and provide connection to a power supply. The metal pattern 893 may include connection pads 892 with insulating material 894 therebetween. As illustrated, the emitter chips 895 include angled or beveled upper edges with a non-rectangular (e.g., polygonal) cross-section. One or more emitter chips 895 may optionally be coated with one or more light-affecting materials (e.g., lumiphoric material, notch filtering material, etc.) in at least one conformal layer 896 and arranged under a hemispherical optical element (e.g., lens) 898, with the at least one conformal layer 896 following the shape and contour of multiple surfaces of the emitter chips 895 (preferably with substantially constant thickness). In certain embodiments, concentration or amount of at least one light-affecting material in the conformal layer 896 may be varied with position relative to the emitter chips 895. As shown in FIG. 14, the at least one conformal layer 896 may extend over, between and laterally beyond the chips 895 (such as over a reflective material disposed between or adjacent to the emitter chips 895). The optical element 898 may be separated from the emitter chips 895 via a gap or an intervening material 897, which may include encapsulant or a fluid medium such as liquid or gel (e.g., mineral oil, perfluorinated polyether (PFPE) liquid, or other fluorinated or halogenated liquid or gel). If provided, such intervening material 897 may also include an index matching medium characterized by a refractive index that provides for reduced or minimal reflection or internal refraction of light emissions. In certain embodiments, the intervening material 897 and the optical element 898 may embody a single element, such as molded silicone. In certain embodiments, the optical element 898 may include one or more light-affecting materials (e.g., lumiphoric material, notch filtering material, color pigment material, etc.) arranged to affect (e.g., increase) at least one gamut property of light transmitted therethrough. Such light-affecting material may be doped, coated, impregnated, or otherwise provided in or on at least a portion of the optical element 898. As shown in FIG. 14, a first (e.g., central) portion 898A of the optical element 898 may include a light-affecting material at one concentration, and a second (e.g., peripheral) portion 898B of the optical element 898 may be either devoid of light-affecting material or include light-affecting material at a different concentration relative to the first (central) portion 898A. In operation of the solid state light emitting device 890, upon passage of light through one or more light-affecting materials (e.g., associated with different portions of the at least one conformal layer 896 and/or different portions of the optical element 898), at least two beams or portions of light emitted in different directions from the lighting device 890 may exhibit different gamut properties. Alternatively, two or more emitter chips 895 or groups thereof (optionally in conjunction with lumiphoric material and/or notch filtering material) may be aimed in different directions and arranged to generate emissions having different gamut properties, in order to emit beams with different gamut properties in different directions. In certain embodiments, a central output region R1 may include emissions with an elevated gamut property relative to an emissions of a peripheral output region R2. In other embodiments, the opposite result may be obtained.

In certain embodiments, at least a portion of a diffuser of a lighting device may include at least one light-affecting material. In certain embodiments, at least one light-affecting material (arranged to affect gamut properties) may differ in presence, composition, thickness, concentration, and/or patterning with respect to position in or on the diffuser, such that different portions of the diffuser are arranged to transmit light beams having different gamut properties.

Figure 15:
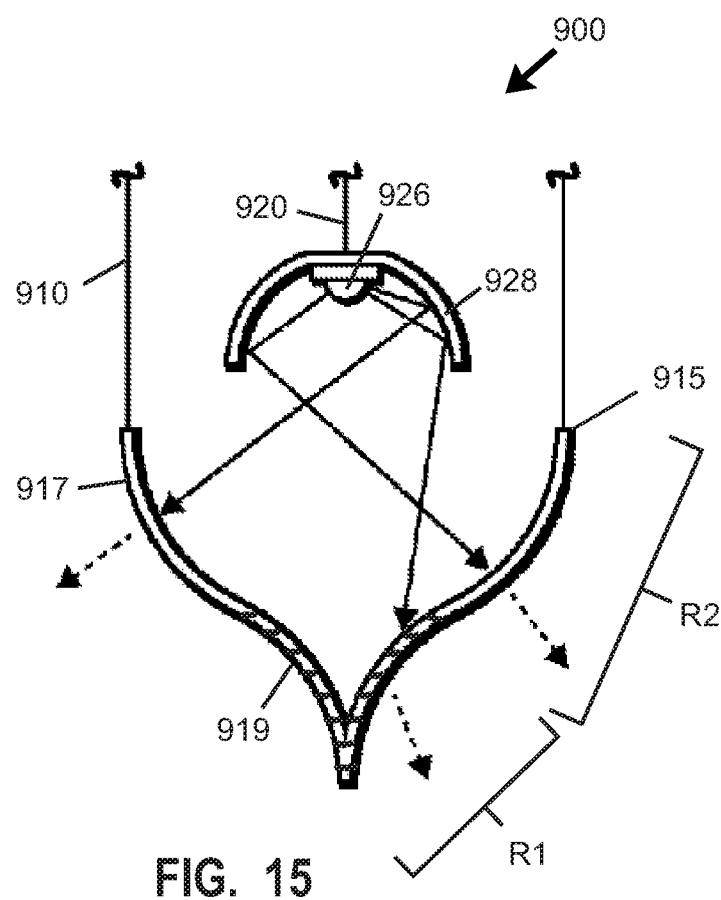
FIG. 15 is a side cross-sectional view of a pendant mount direct lighting device embodying a centrally-arranged light-affecting element positioned on a diffuser.

FIG. 15 is a side cross-sectional view of a pendant mount direct lighting device 900 including a diffuser 915 with a central region 919 including a light-affecting material arranged to affect at least one gamut property, and with a peripheral region 917 that is either devoid of light-affecting material or includes light-affecting material differing in presence, composition, thickness, concentration, and/or patterning relative to the central region 919. Light-affecting material may be doped, coated, impregnated, or otherwise provided in or on at least portions of the diffuser 915. An electrically activated light emitter 926 is arranged within a reflector 928 suspended by a first support 920, with the reflector 928 and electrically activated light emitter 926 being arranged to cast light in a generally downward direction toward the diffuser 915, which is supported by a diffuser support element 910. At least one light-affecting material (e.g., lumiphoric material, notch filtering material, color pigment material, etc.) may be arranged to affect (e.g., increase) at least one gamut property of light transmitted therethrough. In operation of the device 900, upon passage of light through one or more light-affecting materials associated with different portions of the diffuser 915, at least two beams or portions of light emitted in different directions from the lighting device 900 may exhibit different gamut properties. In certain embodiments, a central output region R1 may include emissions with an elevated gamut property relative to an emissions of a peripheral output region R2. In other embodiments, the opposite result may be obtained.

In certain embodiments, boundaries between light-affecting regions and non-light-affecting regions, or between different light-affecting regions, may be abrupt or may including one or more transition features (e.g., steps, gradients, feathered transitions, sawtooth transitions, or the like) to reduce perceptibility of a boundary between first and second light-emitting regions or areas of a lighting device. In certain embodiments, such transitions may be arranged in or along external portions or external surfaces of a lighting device. In other embodiments, transition regions may be arranged in or along surfaces or structures internal to a lighting device.

FIG. 16 illustrates a lighting device 1000 embodied in a light bulb including a central region 1022 with at least one light-affecting material arranged to affect at least one gamut property of light emissions arranged in or on an upper portion 1020 of a hemispherical globe. A peripheral region 1025 arranged in or on a lower portion of the hemispherical globe may either be devoid of light-affecting material or may include light-affecting material having differing concentration, amount, thickness, and/or patterning relative to the central region 1022. An abrupt transition in light-affecting material is provided between the central region 1022 and the peripheral region 1025. At least one electrically activated emitter 1010 positioned on a reflective submount 1011 may be arranged within a cavity 1028 of the lighting device 1000. A body structure 1005 to which the hemispherical globe may be attached may include a lateral contact 1006 and a foot contact 1007 arranged to mate with an Edison-type threaded light bulb socket. In operation of the lighting device 1000, upon passage of light through one or more light-affecting materials associated with the central region 1022, a first beam having an elevated gamut property is transmitted by the central region 1022, and upon passage of light though the peripheral region 1025, a second beam having a relatively lower gamut property is transmitted by the peripheral region 1025. Thus, at least two beams or portions of light emitted in different directions from the lighting device 1000 may exhibit different gamut properties. In certain embodiments, a central output region R1 may include emissions with an elevated gamut property relative to an emissions of a peripheral output region R2. In other embodiments, the opposite result may be obtained if the peripheral region 1025 includes light-affecting material in an amount sufficient to increase at least one gamut property more than the central region 1022.

FIG. 17 illustrates a lighting device 1030 embodied in a light bulb including a centrally arranged light-affecting region 1052 arranged in or on a hemispherical globe 1050, with a sawtooth or feathered transition region 1059 between the centrally arranged light-affecting region 1052 and a peripheral region 1055 that may either be devoid of light-affecting material or may include light-affecting material having differing concentration, amount, thickness, and/or patterning relative to the central region 1052. The lighting device 1030 includes at least one electrically activated emitter 1040 and a body structure 1035. In operation of the lighting device 1030, upon passage of light through one or more light-affecting materials associated with the centrally arranged light-affecting region 1052, a first beam having an elevated gamut property is transmitted by the centrally arranged light-affecting region 1052, and upon passage of light though the peripheral region 1055, a second beam having a relatively lower gamut property is transmitted by the peripheral region 1055. Light transmitted through the hemispherical globe 1050 proximate to the sawtooth or feathered transition region 1059 has a less abrupt boundary than the lighting device of FIG. 16. The lighting device 1030 is arranged to emit at least two beams or portions of light in different directions exhibiting different gamut properties. In certain embodiments, a central output region R1 may include emissions with an elevated gamut property relative to an emissions of a peripheral output region R2, and a transition output region R1A is provided therebetween. In other embodiments, a peripheral output region R2 may be arranged to increase at least one gamut property more than the central output region R1.

FIG. 18 illustrates a lighting device 1060 embodied in a light bulb including a central region 1082 including light-affecting material arranged in or on a hemispherical globe 1080, with a stepped or gradient transition region 1089 (e.g., including multiple transition subregions 1083, 1084) between the central region 1082 and a peripheral region 1085. The peripheral region 1085 that may either be devoid of light-affecting material or may include light-affecting material having differing concentration, amount, thickness, and/or patterning relative to the central region 1082. The lighting device 1030 includes at least one electrically activated emitter 1070 and a body structure 1065. In operation of the lighting device 1060, upon passage of light through one or more light-affecting materials associated with the central region 1082, a first beam having an elevated gamut property is transmitted by the central region 1082, and upon passage of light though the peripheral region 1085, a second beam having a relatively lower gamut property is transmitted by the peripheral region 1085. Light transmitted through the hemispherical globe 1080 proximate to the stepped or gradient transition region 1089 (e.g., including subregions 1083, 1084) has a less abrupt boundary than the lighting device of FIG. 16. The lighting device 1060 is arranged to emit at least two beams or portions of light in different directions and exhibiting different gamut properties. In certain embodiments, a central output region R1 may include emissions with an elevated gamut property relative to an emissions of a peripheral output region R2, and transition output regions R3A, R3B are provided therebetween. In other embodiments, the peripheral output region R2 may be arranged to increase at least one gamut property more than the central output region R1.

FIG. 19A is a perspective view of a lighting device embodied in a reflector-type light bulb 1100 including a central region 1111 including at least one light-affecting material (e.g., arranged to increase a gamut property of light transmitted therethrough) arranged in or on a lens or cover portion 1110 of the bulb. A peripheral region 1112 may either be devoid of light-affecting material or may include light-affecting material having differing concentration, amount, thickness, and/or patterning relative to the central region 1111. The reflector type light bulb 1100 includes at least one electrically activated emitter (not shown) arranged proximate in a reflector 1108 extending from a body portion 1104 having a lateral contact 1102 and a foot contact 1101 arranged to mate with an Edison-type threaded light bulb socket. In operation of the device 1100, upon passage of light through one or more light-affecting materials associated with the central region 1111, a first beam having an elevated gamut property is transmitted by the central region 1111, and upon passage of light though the peripheral region 1112, a second beam having a relatively lower gamut property is transmitted by the peripheral region 1112. The light bulb 1100 may include a relatively abrupt transition between the central region 1111 and the peripheral region 1112.

FIG. 19B illustrates a circular lens or cover portion 1110B of a light bulb including a central region 1111B including light-affecting material disposed therein or thereon, with a stepped or gradient transition (including subregions 1113B1, 1113B2) between the central region 1111B and a peripheral region 1112B. The peripheral region 1112B may either be devoid of light-affecting material or may include light-affecting material having differing concentration, amount, thickness, and/or patterning relative to the central region 1111B. The gradient transition subregions 1113B1, 1113B2 may include light-affecting material in an amount, thickness, concentration, or pattern between that of the central region 1111B and peripheral region 1112B.

FIG. 19C illustrates a circular lens or cover portion 1110C of a light bulb including a central region 1111C including light-affecting material disposed therein or thereon, with a sawtooth or feathered transition 1113C between the central region 1111C and a peripheral region 1112C. The peripheral region 1112C may either be devoid of light-affecting material or may include light-affecting material having differing concentration, amount, thickness, and/or patterning relative to the central region 1111C.

In certain embodiments, a peripheral region of a lighting device may be arranged to provide a light beam with an increased gamut property relative to a beam provided by a central region of a lighting device.

FIG. 20 illustrates lighting device 1200 embodied in a light bulb including at least one electrically activated emitter 1210 arranged within a cavity 1228 of hemispherical globe 1220 that may serve as a diffuser, wherein a peripheral region 1215 of the hemispherical globe 1220 (proximate to a tapered body portion 1205A and a base portion 1206 of the lighting device 1200) includes a light-affecting material arranged to increase a gamut property of emissions transmitted therethrough, and a central region 1222 of the hemispherical globe 1220 is either devoid of light-affecting material or may include light-affecting material having differing concentration, amount, thickness, and/or patterning relative to the peripheral region 1215, whereby light transmitted through the central region 1222 has a lower gamut property value than light transmitted through the peripheral region 1215. In operation of the lighting device 1200, upon passage of light through one or more light-affecting materials associated with the peripheral region 1215, a first beam having an elevated gamut property is transmitted by the peripheral region 1215, and upon passage of light though the central region 1222, a second beam having a relatively lower gamut property is transmitted by the central region 1222. In certain embodiments, a peripheral output region R1 may include emissions with an elevated gamut property relative to an emissions of a central output region R2.

In certain embodiments, one or more light-affecting materials as disclosed herein may be arranged within an interior portion or cavity of a lighting device that is bounded by a lens, diffuser, or globe in fluid communication with an ambient environment, wherein the one or more light-affecting materials are not arranged in contact with the lens, diffuser, or globe. In certain embodiments, the one or more light-affecting materials may be associated with a light-transmissive element that is internal to the lighting device and not in fluid communication with an ambient environment, wherein the light-transmissive element may be arranged within a cavity bounded by the lens, diffuser, or globe.

FIG. 21 illustrates a lighting device 1300 embodied in a light bulb including at least one electrically activated emitter 1306 arranged within a first cavity or space 1304 bounded by an internally arranged light-transmissive element 1311. A first (e.g., central) portion 1313 of the internally arranged light-transmissive element 1311 comprises a light-affecting material arranged to increase a gamut property of light emissions transmitted therethrough, and a second (e.g., peripheral) portion 1312 of the internally arranged light-transmissive element 1311 is either devoid of light-affecting material or may include light-affecting material having differing concentration, amount, thickness, and/or patterning relative to the central portion 1313, whereby light transmitted through the peripheral portion 1312 has a lower gamut property value than light transmitted through the central portion 1313. The internally arranged light-transmissive element 1311 is arranged within a cavity or space 1304, 1309 bounded by a curved or hemispherical globe 1308, which may also serve as a diffuser. In certain embodiments, one or both of the cavities or spaces 1304, 1309 may be hollow, or may include a light-transmissive medium therein. In certain embodiments, a light-transmissive medium may comprise a fluid medium that may be arranged to conduct heat to a heatsink 1303 arranged between the at least one electrically activated emitter 1306 and electrical contacts (e.g., a lateral contact 1302 and a foot contact 1301) associated with the lighting device 1300. The lighting device 1300 is arranged to emit at least two beams or portions of light in different directions and exhibiting different gamut properties. In certain embodiments, a central output region R1 may include emissions with an elevated gamut property relative to an emissions of a peripheral output region R2. In other embodiments, an opposite result may be obtained by repositioning light-affecting material among the peripheral portion 1312 and the central portion 1313 of the internally arranged light-transmissive element 1311.

In certain embodiments, electrically activated emitters of a lighting device may be arranged to produce emissions having different gamut properties and may be oriented in different directions to emit at least two beams or portions of light that exhibit different gamut properties in different directions. In certain embodiments, such a lighting device may be embodied in a light bulb, and multiple electrically activated emitters may be supported by a single support column, substrate, or other support element.

Figure 22:
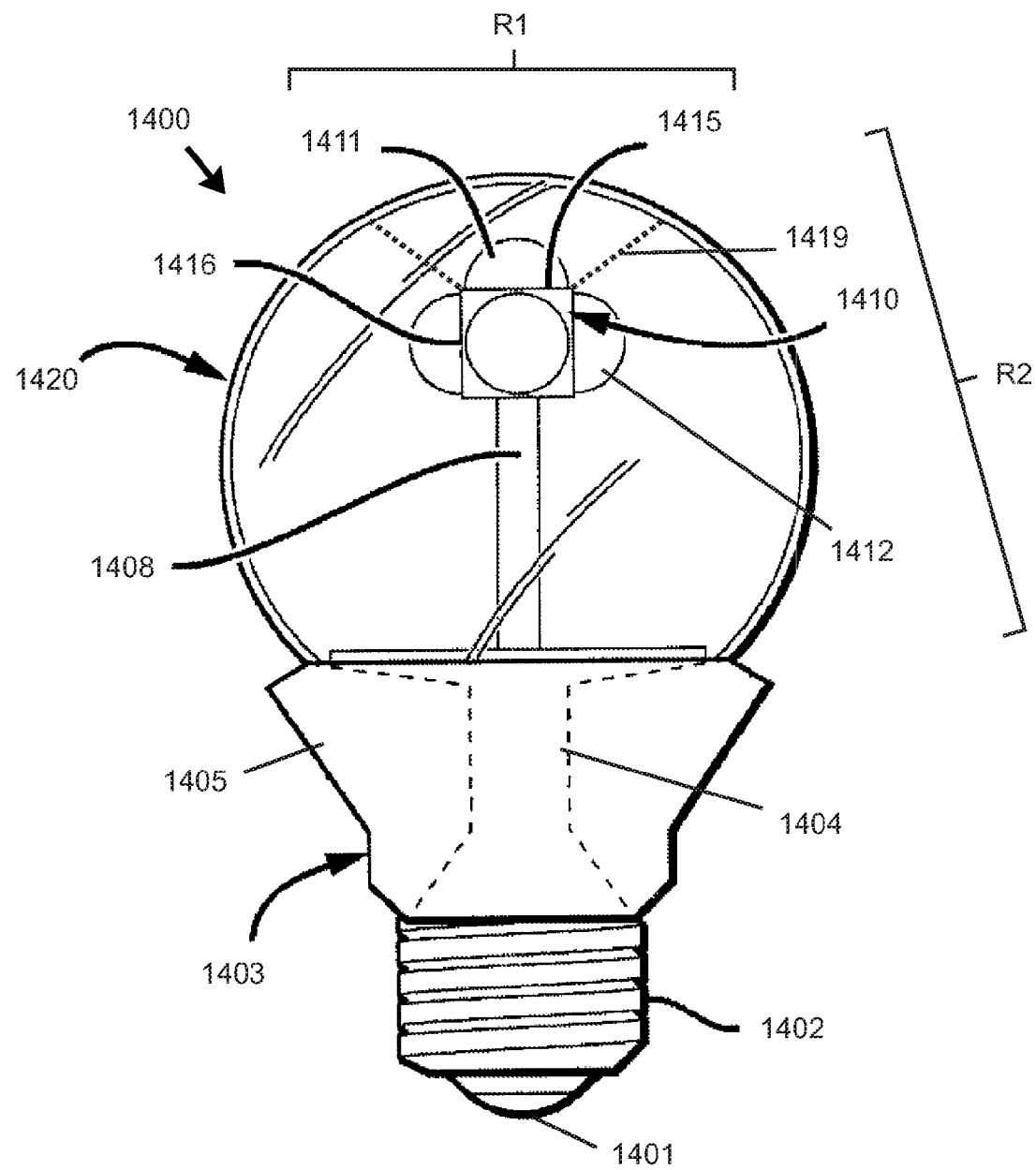
FIG. 22 is an elevation view of a lighting device embodied in a light bulb including multiple electrically activated light emitters supported by a central support column (e.g., preferably having different gamut properties between different emitters or groups thereof).

FIG. 22 illustrates a lighting device 1400 embodied in a light bulb including multiple electrically activated light emitters 1411, 1412 supported by a central support 1410 including a horizontal surface 1415 and multiple vertical surfaces 1416, with the central support 1410 being supported by a column 1408 extending upward from a body structure 1403 having multiple fins 1405 extending from a central core 1404. The lighting device 1400 includes a lateral contact 1402 and a foot contact 1401 suitable for mating with a threaded Edison-type light bulb socket. The electrically activated emitters 1411, 1412 and central support 1410 are arranged within a cavity bounded by a hemispherical globe 1420. The electrically activated light emitters 1411 supported by the horizontal surface 1415 may be arranged to produce emissions having a gamut property that differs from emissions produced by the electrically activated light emitters 1412 supported by the vertical surfaces 1416. In certain embodiments, partial light blocking and/or diffusing elements 1419 may be arranged between the horizontally and vertically arranged electrically activated light emitters 1411, 1412. The lighting device 1400 is arranged to emit at least two beams or portions of light in different directions and exhibit different gamut properties, owing to different gamut properties of the electrically activated light emitters 1411, 1412 aimed in different directions. In certain embodiments, a central output region R1 may include emissions with an elevated gamut property relative to an emissions of a peripheral output region R2. In other embodiments, an opposite result may be obtained.

In certain embodiments, a light-affecting material may be associated with a reflector arranged to receive only a portion of light emitted by one or more electrically activated emitters, with the light-affecting material being arranged to affect (e.g., increase) a gamut property of reflected emissions. In certain embodiments, a reflector may include multiple segments radiating out from a single support, wherein a portion of light emitted by one or more solid state light emitters may impinge on light-affecting material, and another portion of light may escape between the multiple reflector segments. Such a reflector may be non-planar in shape.

FIG. 23A illustrates a non-planar, substantially flower-shaped light-affecting structure 1550 arranged to be positioned between electrically activated light emitters and a lens or diffuser of a lighting device. The light-affecting structure 1550 includes multiple curved segments 1556 extending upward and outward from a tubular base 1552, with gams 1562 between adjacent segments 1556. Each segment 1556 may include an upper surface 1554 arranged distal from one or more electrically activated emitters (such as emitters 1558 illustrated in FIG. 23C), and may include a lower surface 1557 including at least one light-affecting material arranged to increase a gamut property of light reflected by the lower surface 1557. FIG. 23B is a top plan view of the light-affecting structure 1550 of FIG. 23A. FIG. 23C is a side cross-sectional view of at least a portion of a lighting device 1500 including the light-affecting structure 1550 of FIGS. 23A-23B positioned between electrically activated light emitters 1558 and a curved lens or globe 1564 which may serve as a diffuser. Although FIG. 23C illustrates the segments 1556 as having substantially the same shape and curvature, in certain embodiments one or more segments may have a different shape and/or curvature, as indicated by a modified segment 1560 illustrated in dashed lines. The lighting device 1500 is arranged to emit at least two beams or portions of light in different directions and exhibit different gamut properties, owing to the presence of light-affecting material arranged in or on lower surfaces 1557 of the segments 1556. In operation of the lighting device 1500, one portion of emissions generated by the electrically activated light emitters 1558 is transmitted upward and/or laterally outward without impinging on lower surfaces 1557 of the segments 1556, whereas another portion of emissions generated by the electrically activated light emitters 1558 impinges on lower surfaces 1557 of the segments 1556 to interact with light-affecting material and be reflected in a peripheral direction. In this manner, a peripheral output region R1 may include emissions with an elevated gamut property relative to an emissions of a central output region R1.

In certain embodiments, at least one light-affecting material may be suspended or otherwise arranged within a light-transmissive element that spans across a portion of an interior of a lighting device. In certain embodiments, the light-transmissive element may be non-planar in shape.

FIG. 24 illustrates a lighting device 1600 that may be embodied in a light bulb including a body structure or base 1602, at least one electrically activated emitter 1604, a light-transmissive lens or globe 1606 defining an internal cavity 1609, and a light-transmissive element 1608 that spans across a portion of the internal cavity 1609, that includes at least one light-affecting material, and that is suspended within the internal cavity 1609 by at least one internal support 1607 extending from the base 1602. The light-affecting material associated with the light-transmissive element 1608 may be arranged to affect (e.g., increase) gamut of emissions transmitted therethrough. The lighting device 1600 is arranged to emit at least two beams or portions of light in different directions and exhibit different gamut properties. In operation of the lighting device 1600, a first portion of emissions generated by the at least one electrically activated emitter 1604 is transmitted through the light-transmissive element 1608 and interacts with the light-affecting material to affect (e.g., increase) a gamut property of such emissions, and a second portion of emissions generated by the at least one electrically activated emitter 1604 escapes the lighting device 1600 without impingement on the light-transmissive element 1608. In certain embodiments, a central output region R1 may include emissions with an elevated gamut property relative to an emissions of a peripheral output region R2.

FIG. 25 illustrates a side cross-sectional view of at least a portion of another lighting device 1620 substantially similar to the device of FIG. 24, but with a light-transmissive element that is suspended within a cavity 1629 by at least one internal support 1627 that extends from a light-transmissive lens or globe 1626 arranged to bound the cavity 1629 of the lighting device 1620. The lighting device 1620 includes at least one electrically activated emitter 1624 and a body structure or base 1622. The lighting device 1620 is arranged to emit at least two beams or portions of light in different directions and exhibiting different gamut properties. In operation of the lighting device 1620, a first portion of emissions generated by the at least one electrically activated emitter 1624 is transmitted through a light-transmissive element 1628 and interacts with the light-affecting material to affect (e.g., increase) a gamut property of such emissions, and a second portion of emissions generated by the at least one electrically activated emitter 1624 escapes the lighting device 1620 without impingement on the light-transmissive element 1628. In certain embodiments, a central output region R1 may include emissions with an elevated gamut property relative to an emissions of a peripheral output region R2.

Figure 26A:
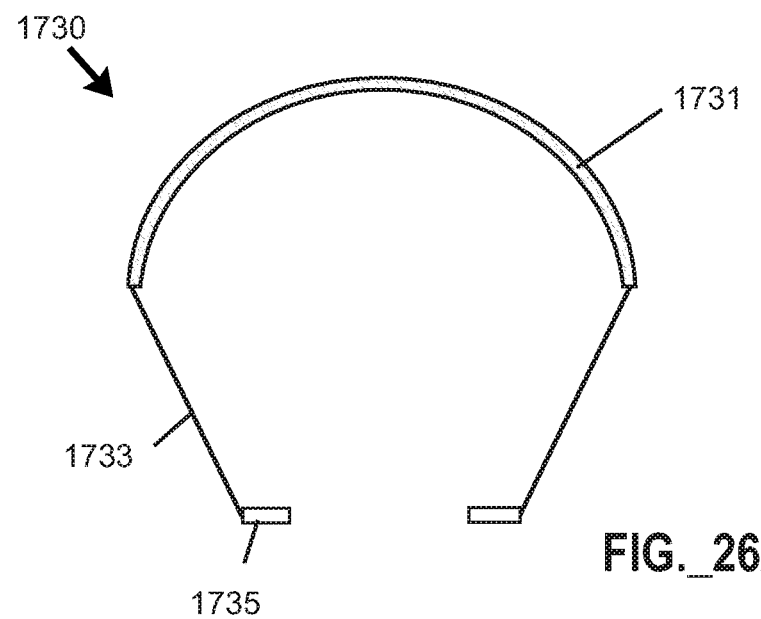
FIG. 26A is a side cross-sectional view of a retrofit element for a lighting device that includes a light-affecting material supported by an attachment structure, wherein the attachment structure is arranged for removable attachment to a base or body structure of a light bulb.

FIG. 26A illustrates a retrofit element 1730 for a lighting device that includes a light-transmissive element 1731 containing a light-affecting material, a support element 1733, and an attachment structure 1735 arranged for removable attachment to a base or body structure of a light bulb. One or more support elements 1733 may include one or more rigid wires or other narrow elements preferably arranged for only minimal blocking of light. The light-affecting material is suitable for affecting (e.g., increasing) gamut of emissions transmitted therethrough. In certain embodiments, the light-transmissive element 1731 may be arranged to cover only a portion of a light-emitting surface of a lighting device.

Figure 26B:
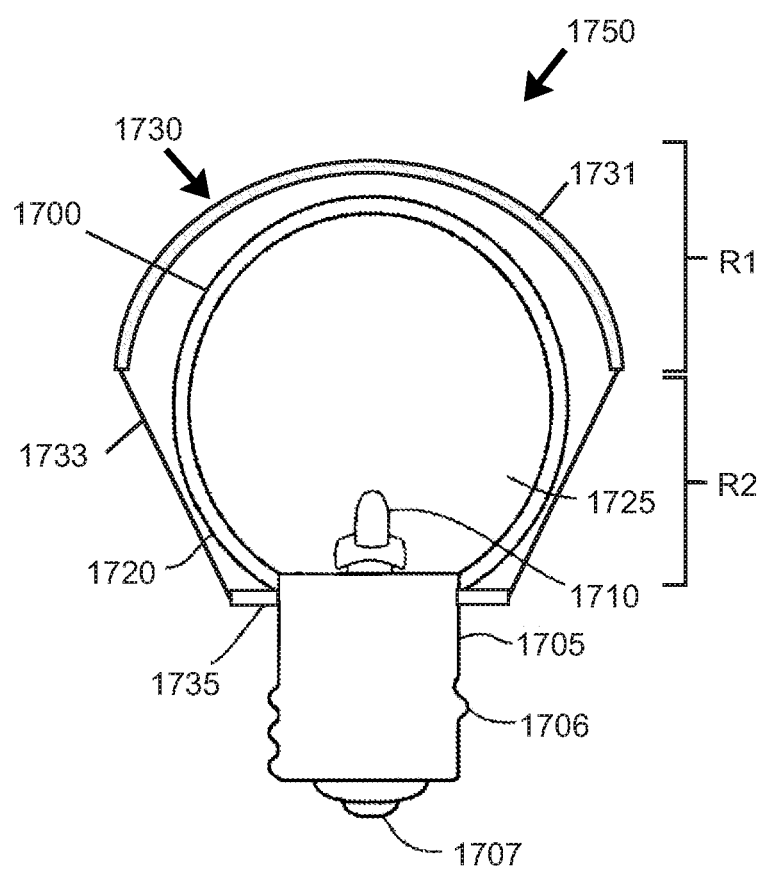
FIG. 26B is a side cross-sectional view of the retrofit element of FIG. 26A attached to a base or body structure of a light bulb.

FIG. 26B illustrates an assembly 1750 including the retrofit element 1730 of FIG. 26A attached to a base or body structure 1705 of a lighting device 1700 that includes a light-transmissive globe or cover 1720 bounding a cavity 1725 including at least one electrically activated emitter 1710 arranged therein. The lighting device 1700 further includes a lateral contact 1706 and a foot contact 1707 arranged for mating with an Edison-type threaded light bulb socket. As shown in FIG. 26B, the light-transmissive element 1731 containing a light-affecting material is arranged to cover only a portion of the light-transmissive globe or cover 1720 of the lighting device 1700, so that only a portion of emissions generated by the lighting device 1700 interact with light-affecting material. The attachment structure 1735 may include at least one threaded, snap-fit, compressive, or adhesive fastener suitable for mating with the base or body structure 1705. In certain embodiments, the attachment structure 1735 may include a collar arranged to mate with the base or body structure 1705, and the support elements 1733 may be arranged for removable insertion into recesses (not shown) defined in the attachment structure 1735. Other removable attachment means will be apparent to one skilled in the art. In operation of the assembly 1750 including the lighting device 1700, a first portion of emissions generated by the at least one electrically activated emitter 1710 is transmitted through the light-transmissive globe 1720 to impinge on the light-transmissive element 1731 of the retrofit element 1730 and interacts with light-affecting material therein to affect (e.g., increase) a gamut property of such emissions. A second portion of emissions generated by the at least one electrically activated emitter 1710 escapes the assembly 1750 without impingement on the light-transmissive element 1730. In certain embodiments, a first (e.g., central) output region R1 may include emissions with an elevated gamut property relative to an emissions of a second (e.g., peripheral) output region R2. In this manner, different beams or emission portions having different gamut properties may be cast in different directions when exiting the assembly 1750 including the lighting device 1700 and the retrofit element 1730.

Figure 27:
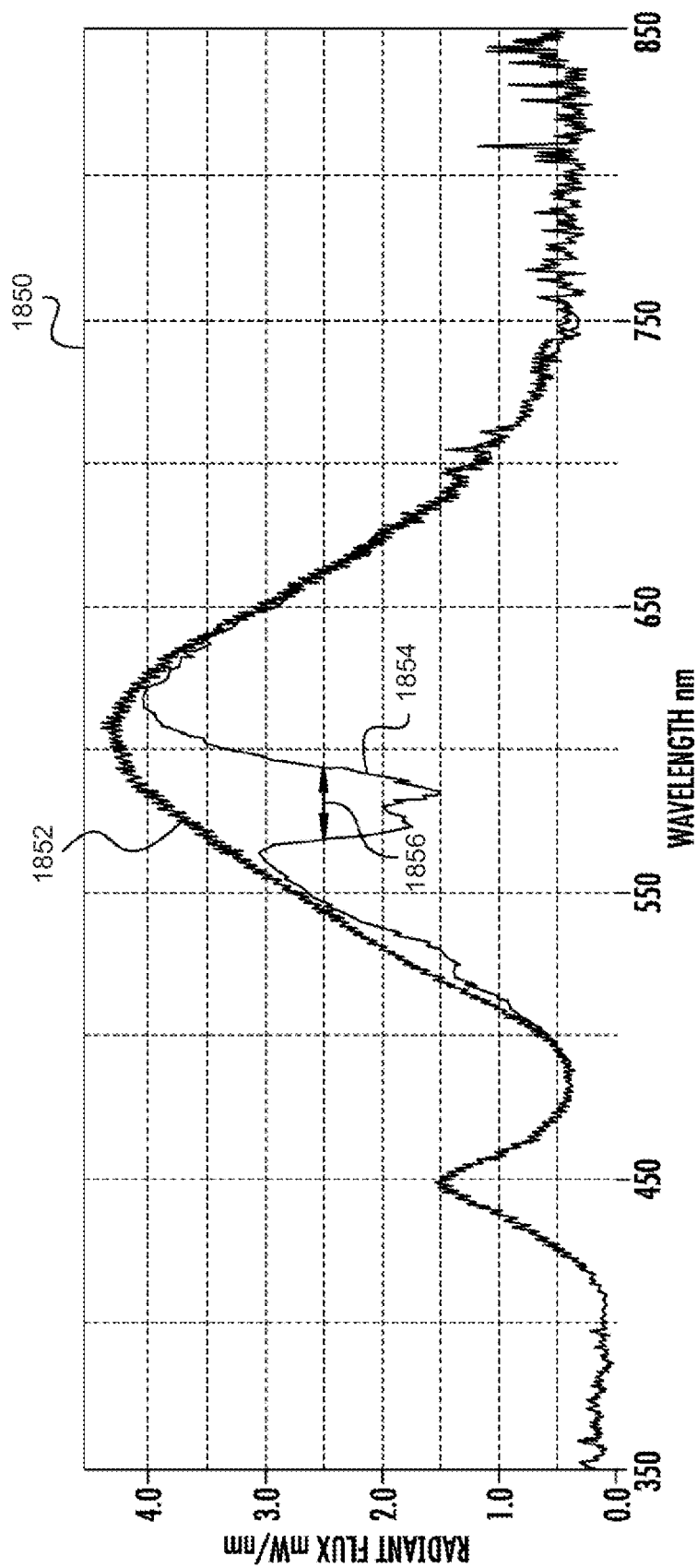
FIG. 27 is a plot of radiant flux versus wavelength for a spectral output of a solid state light-emitting device with superimposed notch filtered spectral output.

FIG. 27 is a graph 1850 plotting radiant flux versus wavelength for a spectral output of a solid state light-emitting device with superimposed notch filtered spectral output, as relating to certain embodiments that may include one or more notch filtering materials. Curve 1852 is a plot of measurements taken of the light output of an LED lamp constructed including a multi-chip LED component in a mineral-oil filled, plain glass enclosure. Curve 1854 is a plot of measurements taken of the light output of an LED lamp that is the same in most respects, except that the enclosure for the lamp measured for curve 1854 is neodymium oxide doped glass. A notch is clearly visible between 550 nm and 650 nm wherein radiant flux is reduced due to filtering by the neodymium oxide notch filtering material. Measurement 1856 represents the width of the notch corresponding to the comparative reduction in light intensity at half the maximum reduction caused by the notch, otherwise known from the field of signal processing as the full width at half the maximum (FWHM). Relative to the peak radiant flux of approximately 4.3 mW/nm, the notch filtered region includes a radiant flux trough of between 1.5-2 mW/nm. The difference between the two curves 1852, 1854 represents attenuation or reduction of light intensity. The notch shown in FIG. 27 is characteristic of neodymium oxide filtering material by including a relatively sharply sloping ("hard") shape profile and is more of a true "notch," as opposed to a filtered shape with a more gently sloping or "soft" notch that may be more characteristic of filtering materials such as color pigments.

FIG. 28 provides a line chart 1900 illustrating spectral transmittance versus wavelength for an illustrative color pigment material arranged to provide a spectral notch 1902 centered at about 580 nm. Transmittance of the color pigment material is nearly 100% at or below wavelengths of about 430 nm, and at or above wavelengths of about 730 nm. Between 430 nm and 730 nm, transmittance is reduced (to a minimum of about 50% at a wavelength of about 580 nm). As shown in FIG. 28, a color pigment may provide a softer spectral notch (with more gradually sloping wavelength attenuation) characteristic relative to other notch filtering materials such as rare earth metals and their oxides (e.g., as shown in FIG. 27).

Embodiments as disclosed herein may provide one or more of the following beneficial technical effects: enhanced aesthetics of emissions of lighting devices; enhancing perceived quality of emissions of lighting devices; enhancing vividness of colors represented by lighting devices; and permitting multiple surfaces or objects to be illuminated with different vividness by a single lighting device.

Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A lighting device comprising:
   at least one electrically activated light emitter;
   a first light-emitting region arranged to transmit or reflect at least a first portion of emissions of the at least one electrically activated light emitter in a first direction, wherein the at least a first portion of emissions comprises a first gamut area index (GAI) value; and
   a second light-emitting region arranged to transmit or reflect at least a second portion of emissions of the at least one electrically activated light emitter in a second direction, wherein the at least a second portion of emissions comprises a second gamut area index (GAI) value;
   wherein the second GAI value differs from the first GAI value by at least 10%; and
   wherein the lighting device comprises at least one of the following features (i) to (v):
   (i) at least one of the first light-emitting region or the second light-emitting region comprises at least one light-affecting material arranged to increase gamut area index, and at least one of composition, concentration, thickness, or patterning of the at least one light-affecting material differs among the first light-emitting region and the second light-emitting region;
   (ii) the first light-emitting region comprises a first lumiphoric material, and the second light-emitting region comprises a second lumiphoric material that comprises a different dominant wavelength than the first lumiphoric material;
   (iii) the at least one electrically activated light emitter comprises at least one first electrically activated light emitter arranged to provide the first portion of emissions to the first light-emitting region, and comprises at least one second electrically activated light emitter arranged to provide the second portion of emissions to the second light-emitting region, wherein the at least one first electrically activated light emitter is arranged to produce spectral output having a gamut area index (GAI) value that exceeds a corresponding GAI value of spectral output produced by the at least one second electrically activated light emitter;
   (iv) at least one transition region is arranged between the first light-emitting region and the second light-emitting region, wherein the at least one transition region is arranged to provide a gradient, feathered, or sawtooth transition of gamut area index values between the first light-emitting region and the second light-emitting region;
   (v) the first portion of emissions, in an absence of any additional light, embodies a first color point; the second portion of emissions, in the absence of any additional light, embodies a second color point; and one of the first color point or the second color point has (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

2. The lighting device of claim 1, wherein the first direction comprises a vertical direction, and wherein the second direction comprises a lateral direction.

3. The lighting device of claim 1, wherein:
at least one of the first light-emitting region or the second light-emitting region comprises at least one light-affecting material arranged to increase gamut area index; and
at least one of composition, concentration, thickness, or patterning of the at least one light-affecting material differs among the first light-emitting region and the second light-emitting region.

4. The lighting device of claim 3, wherein the at least one light-affecting material is arranged in or on a light-transmissive element.

5. The lighting device of claim 3, wherein the at least one light-affecting material comprises a notch filtering material arranged to receive at least a portion of emissions generated by the at least one electrically activated light emitter and filter the received emissions to exhibit a spectral notch.

6. The lighting device of claim 3, wherein the at least one light-affecting material comprises at least one lumiphoric material.

7. The lighting device of claim 3, wherein the at least one light-affecting material is arranged in or on a light-reflective element.

8. The lighting device of claim 1, wherein the first light-emitting region comprises a first lumiphoric material, and the second light-emitting region comprises a second lumiphoric material that comprises a different dominant wavelength than the first lumiphoric material.

9. The lighting device of claim 1, wherein the at least one electrically activated light emitter comprises at least one first electrically activated light emitter arranged to provide the first portion of emissions to the first light-emitting region, and comprises at least one second electrically activated light emitter arranged to provide the second portion of emissions to the second light-emitting region, wherein the at least one first electrically activated light emitter is arranged to produce spectral output having a gamut area index (GAI) value that exceeds a corresponding GAI value of spectral output produced by the at least one second electrically activated light emitter.

10. The lighting device of claim 9, wherein the lighting device comprises a user input element or sensor, wherein any of (i) the at least one first electrically activated light emitter and (ii) the at least one second electrically activated light emitter is operated responsive to an output signal of the user input element or sensor.

11. The lighting device of claim 1, wherein at least one transition region is arranged between the first light-emitting region and the second light-emitting region, wherein the at least one transition region is arranged to provide a gradient, feathered, or sawtooth transition of gamut area index values between the first light-emitting region and the second light-emitting region.

12. The lighting device of claim 1, further comprising a lens or diffuser arranged to transmit at least one of the first portion or the second portion of emissions of the at least one electrically activated light emitter.

13. The lighting device of claim 1, wherein:
the first portion of emissions, in an absence of any additional light, embodies a first color point;
the second portion of emissions, in the absence of any additional light, embodies a second color point; and
one of the first color point or the second color point has (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

14. The lighting device of claim 1, wherein at least one of the first light-emitting region or the second light-emitting region comprises at least one light-affecting material arranged to increase gamut area index, and wherein presence of the at least one light-affecting material differs among the first light-emitting region and the second light-emitting region.

15. A lighting device comprising:
at least one first electrically activated light emitter arranged to produce, in an absence of any additional light, emissions having a first gamut area index (GAI) value; and
at least one second electrically activated light emitter arranged to produce, in the absence of any additional light, emissions having a second gamut area index (GAI) value, wherein the second GAI value differs from the first GAI value by at least 10%;
wherein the at least one first electrically activated light emitter is arranged to illuminate a first region of a light output surface or area of the lighting device;
wherein the at least one second electrically activated light emitter is arranged to illuminate a second region of the light output surface or area of the lighting device; and
wherein the lighting device comprises at least one of the following features (i) to (vi):
(i) the first region is arranged to transmit or reflect at least a portion of emissions of the at least one first electrically activated light emitter in a vertical direction, and the second region is arranged to transmit or reflect at least a portion of emissions of the at least one second electrically activated light emitter in a lateral direction;
(ii) the at least one first electrically activated light emitter comprises a first lumiphoric material having a first dominant wavelength, the at least one second electrically activated light emitter comprises a second lumiphoric material having a second dominant wavelength, and the second dominant wavelength differs from the first dominant wavelength;
(iii) at least one of the first region or the second region comprises at least one light-affecting material arranged to increase gamut area index, and at least one of composition, concentration, thickness, or patterning of the at least one light-affecting material differs among the first region and the second region;
(iv) the lighting device comprises at least one intermediate region arranged between the first region and the second region of the light output surface or area of the lighting device, wherein the at least one intermediate region is arranged to transmit emissions having a gamut area index (GAI) value between the first GAI value and the second GAI value;
(v) the lighting device comprises at least one transition region arranged between the first region and the second region, wherein the at least one transition region is arranged to provide a gradient transition, a feathered transition, or a sawtooth transition of gamut area index values between the first region and the second region;
(vi) emissions of the at least one first electrically activated light emitter, in the absence of any additional light, embody a first color point; emissions of the at least one second electrically activated light emitter, in the absence of any additional light, embody a second color point; and one of the first color point and the second color point has (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

16. The lighting device of claim 15, wherein the first region is arranged to transmit or reflect at least a portion of emissions of the at least one first electrically activated light emitter in a vertical direction, and the second region is arranged to transmit or reflect at least a portion of emissions of the at least one second electrically activated light emitter in a lateral direction.

17. The lighting device of claim 15, further comprising a notch filtering material arranged to receive at least a portion of emissions generated by the at least one first electrically activated light emitter and filter the received emissions to exhibit a spectral notch.

18. The lighting device of claim 15, wherein the at least one first electrically activated light emitter comprises a first lumiphoric material having a first dominant wavelength, the at least one second electrically activated light emitter comprises a second lumiphoric material having a second dominant wavelength, and the second dominant wavelength differs from the first dominant wavelength.

19. The lighting device of claim 15, wherein:
at least one of the first region or the second region comprises at least one light-affecting material arranged to increase gamut area index; and
at least one of composition, concentration, thickness, or patterning of the at least one light-affecting material differs among the first region and the second region.

20. The lighting device of claim 19, wherein the at least one light-affecting material comprises a notch filtering material arranged to receive at least a portion of emissions generated by any of the at least one first electrically activated light emitter or the at least one second electrically activated light emitter, and filter the received emissions to exhibit a spectral notch.

21. The lighting device of claim 19, wherein the at least one light-affecting material comprises at least one lumiphoric material.

22. The lighting device of claim 15, wherein the lighting device comprises at least one intermediate region arranged between the first region and the second region of the light output surface or area of the lighting device, wherein the at least one intermediate region is arranged to transmit emissions having a gamut area index (GAI) value between the first GAI value and the second GAI value.

23. The lighting device of claim 15, wherein the lighting device comprises at least one transition region arranged between the first region and the second region, wherein the at least one transition region is arranged to provide a gradient transition, a feathered transition, or a sawtooth transition of gamut area index values between the first region and the second region.

24. The lighting device of claim 15, further comprising a lens or diffuser arranged to transmit at least a portion of emissions of each of the at least one first and the at least one second electrically activated light emitter.

25. The lighting device of claim 15, wherein:
emissions of the at least one first electrically activated light emitter, in the absence of any additional light, embody a first color point;
emissions of the at least one second electrically activated light emitter, in the absence of any additional light, embody a second color point; and
one of the first color point and the second color point has (x, y) coordinates on a 1931 CIE Chromaticity Diagram that define a point on or within 7 MacAdam ellipses of a white body locus embodying a line including segments defined by the following x, y coordinates on a 1931 CIE Chromaticity Diagram: (0.3114, 0.3386) to (0.3462, 0.3631), (0.3462, 0.3631) to (0.3777, 0.3790), (0.3777, 0.3790) to (0.3977, 0.3707), (0.3977, 0.3707) to (0.4211, 0.3713), and (0.4211, 0.3713) to (0.4437, 0.3808).

26. The lighting device of claim 15, wherein the first region is non-coplanar with the second region.

27. The lighting device of claim 15, wherein at least one of the first region or the second region comprises at least one light-affecting material arranged to increase gamut area index; and wherein presence of the at least one light-affecting material differs among the first region and the second region.

28. A retrofit element for a lighting device that includes a light output surface or area, the retrofit element comprising:
an attachment structure configured for removable attachment to the lighting device; and
a light-affecting material supported by the attachment structure and arranged to span across a portion of the light output surface or area, wherein the light-affecting material is arranged to receive emissions from the lighting device having a first GAI value, interact with the received emissions to produce gamut-altered emissions having a second GAI value that differs from the first GAI value by at least 10%, and transmit the gamut-altered emissions to exit the retrofit element;
wherein the retrofit element comprises one of the following features (i) or (ii):
(i) the attachment structure is configured for removable attachment to a base or body structure of a light bulb, and the light-affecting material is arranged to overlie an outermost light-transmissive globe or lens of the light bulb defining the light output surface or area;
(ii) the attachment structure is configured for removable attachment to a luminaire defining the light output surface or area.

29. The retrofit element of claim 28, wherein the attachment structure is configured for removable attachment to a base or body structure of a light bulb, and the light-affecting material is arranged to overlie an outermost light-transmissive globe or lens of the light bulb defining the light output surface or area.

30. The retrofit element of claim 28, wherein the light-affecting material is arranged in a curved, faceted, or other non-planar conformation.

31. The retrofit element of claim 28, wherein the light-affecting material is arranged in or on a light-transmissive substrate, and at least one of concentration, thickness, or patterning of the light-affecting material varies with position along or relative to the light-transmissive substrate.

32. The retrofit element of claim 28, wherein the attachment structure is configured for removable attachment to a luminaire defining the light output surface or area.

* * * * *